United States Patent [19]
Nakamura et al.

[11] Patent Number: 5,934,542
[45] Date of Patent: Aug. 10, 1999

[54] HIGH STRENGTH BONDING TOOL AND A PROCESS FOR PRODUCTION OF THE SAME

[75] Inventors: Tsutomu Nakamura; Hiroshi Kawauchi; Tetsuo Nakai, all of Itami, Japan

[73] Assignee: Sumitomo Electric Industries, Inc., Japan

[21] Appl. No.: 08/842,515

[22] Filed: Apr. 24, 1997

Related U.S. Application Data

[62] Division of application No. 08/414,787, Mar. 31, 1995, Pat. No. 5,653,376.

[30] Foreign Application Priority Data

| Mar. 31, 1994 | [JP] | Japan | 6-62905 |
| Aug. 8, 1994 | [JP] | Japan | 6-185679 |
| Oct. 28, 1994 | [JP] | Japan | 6-264782 |
| Nov. 14, 1994 | [JP] | Japan | 6-279110 |
| Dec. 20, 1994 | [JP] | Japan | 6-335576 |

[51] Int. Cl.⁶ .................................. B23K 20/02
[52] U.S. Cl. .............. 228/44.7; 228/51; 228/54
[58] Field of Search ................ 228/54, 44.7, 51

[56] References Cited

U.S. PATENT DOCUMENTS

| 5,197,651 | 3/1993 | Nakamura et al. | 228/54 |
| 5,213,248 | 5/1993 | Horton et al. | 228/54 |
| 5,370,299 | 12/1994 | Tanabe et al. | 228/54 |
| 5,425,491 | 6/1995 | Tanaka et al. | 228/44.7 |

FOREIGN PATENT DOCUMENTS

| 4-25138 | 1/1992 | Japan | 228/54 |

*Primary Examiner*—Patrick Ryan
*Assistant Examiner*—Jeffrey T. Knapp
*Attorney, Agent, or Firm*—Wenderoth, Lind & Ponack, L.L.P.

[57] ABSTRACT

The present invention provides a thermocompression tool, i.e. high strength bonding tool used for mounting a semiconductor device or element such as IC, LSI, etc. on a substrate, for example, a tool of pulse heating type used for soldering, and a mounting tool (bonding tool) used for heating, melting and bonding or thermocompression bonding in a lump a number of workpieces to be bonded, making up a part of electronic parts, in particular, a high precision tool called outer lead bonding tool. The high strength bonding tool comprises a substrate consisting of a cemented carbide having microscopic protrusions of hard carbides and/or hard carbonitrides on at least one surface and a coefficient of linear expansion of $4.0 \times 10^{-6}$ to $5.5 \times 10^{-6}/°$ C. at room temperature to 400° C. and a polycrystalline diamond coating formed on the above described surface having microscopic protrusions by a gaseous phase synthesis method, the surface coated with the polycrystalline diamond coating being used as a tool end surface.

15 Claims, 6 Drawing Sheets

HIGH STRENGTH BONDING TOOL AND A PROCESS FOR PRODUCTION OF THE SAME

This is a divisional application of Ser. No. 08/414,787, filed Mar. 31, 1995, now U.S. Pat. No. 5,653,376.

BACKGROUND OF THE INVENTION

1. Field of the Invention

This invention relates to a thermocompression bonding tool used for mounting a semiconductor device or element such as IC, LSI, etc. on a substrate plate.

2. Description of the Prior Art

Lately, various electronic devices using semiconductor elements have been developed and technical progress in this field has become remarkable. In order to draw out the electric properties of semiconductor elements and allow the properties to sufficiently be shown, it is required to bond electrodes formed on the semiconductor devices with leads of a package (inner lead bonding) and bond the leads with outer terminals of a printed circuit substrate (outer lead bonding).

Bonding of the electrodes of semiconductor devices with the leads of a package has hitherto been carried out by a method comprising bonding metallic fine wires (bonding wires) of gold or copper one by one by a tool called capillary, namely, by wire bonding. A mounting method by a wireless bonding technique, using no bonding wire, has lately been watched with keen interest, instead of this wire bonding technique, by excellent features, e.g. high mounting efficiency, large degree of freedom in package designing, etc.

TAB (Tape Automated Bonding) system in which all electrodes of a semiconductor device are in a lump thermocompression-bonded to a film carrier (a printed pattern is formed on a laminated tape of a Cu foil and resin, followed by plating with Sn or Au) has been put to practical use, for example, in mounting ASIC (Application Specific Integerated Circuit) or a liquid crystal display driver. Mounting of TAB system has often been used not only in the inner lead bonding but also in the outer lead bonding. In the outer lead bonding by TAB system, the outer lead of the film carrier is bonded with the printed circuit substrate or lead frame as an outer terminal. In the case of bonding with the printed circuit substrate, a lead of Cu plated with, for example, Sn is bonded with a substrate electrode of, for example, Au using a solder. In the case of bonding with the lead frame, Au on the film carrier tape is bonded with Ag on the lead frame by thermocompression.

For the thermocompression in the mounting by TAB system, there are used tools called bonding tools which can be classified into two kinds of a constant heating system and pulse heating system and can be used properly depending upon the properties of materials to be bonded, etc. Herein, the constant heating system is a system in which a tool is constantly heated directly or indirectly, pressed against a workpiece to be bonded and subjected to heating and melting bonding or thermocompression bonding. The pulse heating system is a system in which a tool is pressed against a workpiece under directly or indirectly heated state for a constant time, cooled to a predetermined temperature, followed by release of the compression against the workpiece, and then subjected to heating, melting and bonding or thermocompression. Namely, this pulse heating system is a system for carrying out heating and cooling of a tool with a constant cycle.

Furthermore, tools having markedly improved properties have lately been developed by the use of diamond as a tool end material. In particular, a tool using a tool end material comprising polycrystalline diamond coated on a specified substrate by a gaseous phase synthesis method (Japanese Patent Laid-Open Publication No. 224349/1990 and Japanese Patent Application No. 62905/1994) has widely been used because of the excellent heat resistance, wear resistance, etc. of the tool.

The constant heating tool is, for example, a tool having a shape as shown in FIG. 1, which comprises a tool shank 1 with a penetrating hole 2 for mounting a heater (not shown) and a tool end material 3 to be always maintained at a thermocompression temperature of 500 to 600° C. by passing electric current through the heater to heat it. This tool is mainly used for bonding other bonding materials than solders.

On the other hand, the pulse heating tool is, for example, a tool 4 having a shape as shown in FIG. 2 or FIG. 3 and the tool of FIG. 2 is the most commonly used pulse heating tool made of a metal or alloy. This tool is mechanically fixed to a bonding machine via a hole 6 for fitting, and after pressing the tool end surface 5 to a workpiece to be bonded, the tool body 4 itself having electrical conductivity is self-heated by passing electric current with a pulse of several second unit corresponding to the cycle of bonding. The tool of FIG. 3 is designed in such a manner that a tool material 3 is bonded to the end of a shank 7 via a bonding metal 8 in the similar manner to the constant heating tool of FIG. 1. This tool aims at improving the wear resistance, heat resistance, etc. of the tool of FIG. 2 by the use of another material than the metals or alloys used in the tool body of FIG. 2. These tools are often used in the case of mainly using a solder for a workpiece to be bonded.

The pulse heating tool is preferably used for soldering, because in the case of a tool of the constant heating system, there arises a problem that the tool is still heated after bonding and the melted solder, adhered to the end surface of the tool, is drawn up with the tool, resulting in contact of bonded parts with each other, while in the case of the pulse heating system, the tool is withdrawn after cooled to a temperature of lower than the melting point of the solder and thus, such a problem does not arise to result in good bonding.

Even when a solder is not used, in many times, the pulse heating tool is more preferably used, since the inflow of heat into a bonding machine is less and the thermal breakage of the machine is hard to occur, as compared with the constant heating tool.

In TAB mounting of ASIC, TCP (Tape Carrier Package) mounted by semiconductor elements by the above described inner lead bonding is bonded with a lead frame using a bonding tool having a different shape. In this case, mounting is carried out by a system (constant heating system) comprising constant heating directly or indirectly a tool having an end shape of a hollow square frustum with an end surface of a rectangular frame to be a pressing surface as shown in FIG. 10 and pressing it to a workpiece to be bonded, made of Au or Ag, thus effecting the thermocompresion thereof.

Such a tool as having the same shape can be applied to a use of mounting a lead of an integrated circuit on a bonding part of a printed circuit substrate precoated with a solder by soldering. In the case of mounting by soldering, the constant heating system results in a problem that since the pressing of the tool is released and the tool is drawn up while a melted solder is adhered to the pressing surface of the tool, adjacent bonding parts are brought into contact with each other. This is not preferable. In this case, therefore, another system (pulse heating system) is employed comprising pressing a tool to a workpiece for a constant time while directly or indirectly heating the tool, then cooling to a constant temperature, releasing the pressing to the workpiece and heating, melting and bonding.

Among mounting techniques by the wireless bonding, in particular, mounting by the flip chip system is capable of corresponding to pitch-narrowing of substrate leads because of directly bonding with the substrate utilizing bumps formed on LSI and has been developed as a mounting method which can be expected to improve the mounting efficiency. In fact, this mounting method has been employed, for example, for mounting MPU of work stations or personal computers, mounting of driver LSI on glass substrates in the production of liquid crystal pannels, etc.

In the mounting of MPU, there is used a mounting method comprising using a tool directly or indirectly heated at a temperature range of 200 to 400° C. to melt and bond a bump consisting of a solder, adsorbing in vacuum and transporting LSI, then pressing it for a constant time and cooling to 200° C. or lower, after which the pressing of the tool is released.

Since in a process for the production of a liquid crystal panel, driver LSI is mounted on a glass substrate via a thermosetting ACF (anisotropic conductive film), in addition to the above described method, there is used a mounting method comprising adsorbing in vacuum and transporting LSI and then pressing it for a constant time under such a sate that the tool is directly or indirectly heated at a temperature range of 200 to 400° C.

As to the properties of such a bonding tool, excellent heat resistance and wear resistance are required, since any one of the tools is constantly or intermittently maintained at a high temperature and a concentrated load is repeatedly applied to a thermocompression bonding part on the tool surface. From this point of view, a hard material consisting predominantly of diamond has been used as a tool material of bonding tool.

Of the tool materials having been used at the present time, single crystal diamond is most excellent as a material property, so this material corresponding to a size of 10 to 15 mm square as a shape of standard tool end under the existing circumstances in the constant heating tool as shown in FIG. 1 is very expensive and application thereof is limited to a small size tool.

On the other hand, sintered diamond can be obtained with a relatively large size, but has a problem, in particular, when using an iron group metal as a binder material as disclosed in Japanese Patent Publication No. 12126/1977, that the heat resistance is insufficient to result in a shortened service life. When the sintered diamond is used as a tool material, as disclosed in Japanese Patent Laid-Open Publication No. 33865/1986, this sintered body has a problem, due to use of Si and/or SiC as a binder for the purpose of improving the heat resistance, that bonding of diamond grains with each other is too weak to maintain a practical wear resistance.

In contrast, ceramics such as sintered bodies consisting predominantly of Si, $Si_3N_4$, SiC or AlN, coated with polycrystalline diamond by a gaseous phase synthesis method, as disclosed in Japanese Patent Laid-Open Publication No. 224349/1990, exhibit excellent properties comparable to single crystal diamond and can be produced with a low cost, so that they have lately been applied to many uses.

From this point of view, it has been proposed to use a hard material consisting predominantly of diamond, instead of metals such as Mo, W, etc. as in the prior art, for the end material of a tool for the outer lead bonding. The inventors propose, as a first embodiment of the present invention, to use cemented carbides coated with polycrystalline diamond by a gaseous phase synthesis method as a tool end material of a tool capable of exhibiting excellent properties for uses of not only the inner lead bonding but also the outer lead bonding. FIG. 4 is a schematic view of one example of the tool structure of the present invention, comprising a diamond-coated substrate 3, tool end surface (polycrystalline diamond) 5, machine fitting parts 6, shank 7 and brazing material 8.

As described above, the tool described in Japanese Patent Laid-Open Publication No. 224349/1990 having various excellent features has broadly been used, but has some problems to be further solved. Firstly, in this tool, ceramics are used as a substrate to be coated with diamond and accordingly, a problem on strength often takes place depending on the using conditions. That is, the problem is lowering of the durability of the ceramics when a bonding load is large or the heating temperature of the tool is high.

Lately, the shape of a semiconductor device itself tends to be large-sized or long-sized with the increase of functions or integrations of the semiconductor device and for the purpose of improving the efficiency, it is begun to employ a system for mounting in lump a plurality of semiconductor devices. Correspndingly to this tendency, it is required for bonding tools to render the shapes thereof large-sized or long-sized. However, in the tool of such a shape, a lowering tendency of liability as to the strength of a ceramic substrate by a larger volume effect is undeniable, as compared with that of a small-sized shape.

Furthermore, another problem than the strength relates to a heat response when this material is used for a pulse heating tool. As apparent from the structure shown in FIG. 3, a pulsating instantaneous heat generation in a shank is propagated through the ceramic substrate and reaches the surface of polycrystalline diamond. Accordingly, the heat response of the tool, determining a mounting cycle, largely depends on the thermal conductivity of the substrate. In the case of the substrate disclosed in Japanese Patent Laid-Open Publication No. 224349/1990, in fact, if its material does not have highly thermal conductivity, the thermal conductivity of the tool is not sufficient and the mounting cycle is thus lengthened by at least two times as long as tools of metals or alloys, as shown in FIG. 2. This is a problem.

Therefore, it is considered most suitable to use a high strength and high thermal conductivity material as a substrate for an ideal TAB tool, which is coated with polycrystalline diamond by a gaseous phase synthesis method. From this point of view, cemented carbides are considered suitable as a substrate for a TAB tool.

The coating technique of polycrystalline diamond onto a cemented carbide substrate has actively been developed for the purpose of mainly aiming at applying to cutting tools and as to the bonding strength of a diamond film having hitherto been considered to be a problem, various improving methods have been proposed. In particular, a surface modifying method comprising subjecting cemented carbides to a heat treatment under special conditions, as disclosed in Japanese Patent Laid-Open Publication No. 330959/1993, is effective for improving the bonding strength. According to this method, the bonding strength between a cemented carbide substrate and diamond coating layer is improved by subjecting a WC-based cemented carbide having a composition comprising, as a binder phase component, 0.5 to 30% by weight of Co and, as a hard dispersed phase forming component, (a) WC, (b) Group IVa, Va and VIa metals of Periodic Table except W or solid solutions thereof with at least one of carbides, nitrides, carbonitrides, oxides, borides, borocarbides, boronitrides and borocarbonitrides thereof and (c) WC and/or (d) WC and Group IVa, Va and VIa metals of Periodic Table except W or solid solutions thereof with at least one of carbides, nitrides, carbonitrides, oxides, borides, borocarbides, boronitrides and borocarbonitrides thereof and unavoidable impurities to a heat treatment, thus modifying the surface thereof and then coating it with polycrystalline diamond by a gaseous phase synthesis method. In this publication, it is further described that when at least one of carbides, nitrides and carbonitrides of at least one of Group IVa, Va and VIa metals of Periodic Table except W is further contained as the hard phase, the high temperature hardness of the substrate can be increased by the presence of these carbides, nitrides and carbonitrides, preferably in a proportion of 0.2 to 40 weight %.

However, the materials described herein include a broad range of compositions varying in property and it has not been made to study which composition or which property is suitable as a material for bonding tools, of these materials.

When using a tool having the structure shown in FIG. 4 for soldering for a long time, there arises a problem that the polycrystalline diamond of the tool end part 5 is stripped from the brazed part to shorten the service life of the tool, in spite of that the polycrystalline diamond itself of the tool end part 5 is not so damaged. The cause of this problem consists in that the solder is melted and evaporated during bonding, adheres to the soldered part and diffused through the solder to change the composition of the solder and to form a brittle intermetallic compound, thus resulting in lowering of the bonding strength by the solder.

Furthermore, in order to improve the mounting efficiency by carrying out at once mounting of a plurality of electronic parts, a tool of several tens mm in length is not sufficient and accordingly, a long-sized tool has lately been desired. For example, in the mounting of a liquid crystal driver, a tool with a length of about at most 400 mm has been required. Even in the case of such a long-sized tool, it has been required for realizing a uniformly bonded state that the flatness of the pressing surface of a tool is at most 3 μm and the maximum temperature gradient is at most 10° C.

As the above described tool, for example, a tool of the pulse heating system using molybdenum or tungsten as the tool material is disclosed in Japanese Utility Model Publication No. 30142/1990. In the tool using such a metal, however, a part in contact with the bonding material is gradually subject to damage by the repeated heating and pressing, thus resulting in a problem that it is difficult to maintain a uniformly bonded state for a long period of time. In such a metallic tool, however, a cleaning working to remove periodically the solder or oxide adhered to the pressing surface is required, during which damage by a cleaning grindstone changes the flatness of the tool pressing surface and unfavorably affects the bonded state. This is a large problem.

In order to solve these problems, it has been considered effective to use a hard material consisting predominantly of diamond or cBN (cubic boron nitride) excellent in heat resistance and wear resistance as a tool end material. However, single crystal diamond is has poor pratcial utility because of being limited in size. In the case of a diamond or cBN sintered body, moreover, there is a problem that it is difficult to work it into an end shape as shown in FIG. 10 and to maintain the flatness of the end surface at a high temperature within a precision range required for a long time since the property of the sintered body is affected by a metallic or non-metallic binder.

In any mounting method, the bonding tool must have an excellent heat resistance as its property, since it is constantly or intermittently allowed to be present under high temperature state. That is, it is required of the tool to directly press LSI without breakage of LSI and to maintain the surface roughness and flatness of the tool end surface under good state without thermal damage for a long time. However, the use of a metallic tool of an Invar alloy or Mo, etc. having hitherto been used up to the present time results in a problem that the property is gradually deteriorated.

Furthermore, as referred to above, the tool surface should periodically be cleaned since the heated and sublimated solder or resin is solidified and adhered thereto. The cleaning is generally carried out by mechanically removing the adhered material, but during the same time, the tool of the prior art meet with a problem that the end surface is scraped to change the shape and a good mounting operation cannot be continued.

SUMMARY OF THE INVENTION

It is an object of the present invention to provide a thermocompression tool, i.e. bonding tool used for mounting a semiconductor device such as IC, LSI, etc. on a substrate, in particular, a tool of pulse heating type used for soldering.

It is another object of the present invention to provide a mounting tool (bonding tool) used for heating, melting and bonding or thermocompression bonding in a lump a number of workpieces to be bonded, making up a part of electronic parts, in particular, a high precision tool called outer lead bonding tool.

It is a further object of the present invention to provide a mounting tool of flip chip system for directly mounting LSI on a printed circuit substrate or glass substrate.

It is a still further object of the present invention to provide a bonding tool in which the property of the tool structural parts is optimized to render the bonding strength between a coated polycrystalline diamond and substrate at least comparable to and the strength and heat response more excellent than that described in Japanese Patent Laid-Open Publication No. 224349/1990, based on the prior technique described in Japanese Patent Laid-Open Publication No. 330959/1993.

It is a still further object of the present invention to provide a pulse heating tool in which falling-off of the tool end part is prevented in a use of soldering even after using for a long time by further improving the first embodiment of the present invention, whereby the above described problems can be solved.

These objects can be attained by a high strength bonding tool comprising a substrate consisting of a cemented carbide having microscopic protrusions of hard carbides and/or hard carbonitrides on at least one surface and a coefficient of linear expansion of $4.0 \times 10^{-6}$ to $5.5 \times 10^{-6}$/° C. at room temperature to 400° C. and a polycrystalline diamond coating formed on the above described surface having microscopic protrusions by a gaseous phase synthesis method, the surface coated with the polycrystalline diamond coating being used as a tool end surface.

BRIEF DESCRIPTION OF THE DRAWINGS

The accompanying drawings are to illustrate the principle and merits of the present invention in detail.

DETAILED DESCRIPTION OF THE INVENTION

Figure 1:
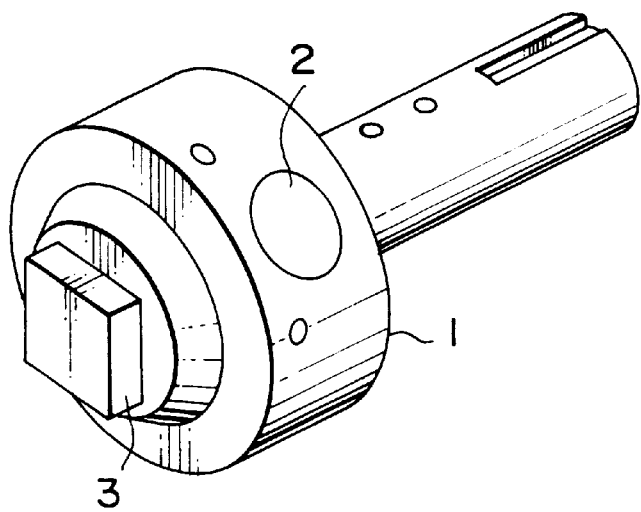
FIG. 1 is a schematic view of one embodiment of the bonding tool of the present invention, i.e. constant heating tool.

The inventors have made various efforts to attain the foregoing objects and consequently, have reached the present invention relating to a bonding tool comprising a substrate consisting of a cemented carbide having the specified properties.

The first main embodiments of the present invention are high strength bonding tools and a process for the production of the same, as shown in the following (1) to (4):

(1) A high strength bonding tool comprising a substrate consisting of a cemented carbide having microscopic protrusions of hard carbides and/or hard carbonitrides on at least one surface and a coefficient of linear expansion of $4.0 \times 10^{-6}$ to $5.5 \times 10^{-6}/°$ C. at room temperature to 400° C. and a polycrystalline diamond coating formed on the above described surface having microscopic protrusions by a gaseous phase synthesis method, the surface coated with the polycrystalline diamond coating being used as a tool end surface.

(2) A high strength bonding tool comprising a tool material consisting of a substrate consisting of a cemented carbide having microscopic protrusions of hard carbides and/or hard carbonitrides on at least one surface and a coefficient of linear expansion of $4.0 \times 10^{-6}$ to $5.5 \times 10^{-6}/°$ C. at room temperature to 400° C., coated with a polycrystalline diamond coating formed on the above described surface having microscopic protrusions by a gaseous phase synthesis method, the tool material being arranged in such a manner that the polycrystalline diamond-coated surface be a tool end surface, and bonded with a shank consisting of at least one of metals and alloys each having a coefficient of linear expansion of $4.0 \times 10^{-6}$ to $5.5 \times 10^{-6}/°$ C. at room temperature to 400° C.

(3) A process for the production of a high strength bonding tool comprising at least the following steps ① to ④, being in order carried out:

① a step of heat treatment for forming microscopic protrusions of hard carbides and/or hard carbonitrides on a cemented carbide having a coefficient of linear expansion of $4.0 \times 10^{-6}$ to $5.5 \times 10^{-6}/°$ C. at room temperature to 400° C., being composed of, as a hard phase, at least one member selected from the group consisting of carbides of Group IVa, Va and VIa elements of Periodic Table and solid solutions thereof, and having a composition of 70 to 95 weight % of WC, 2 to 25 weight % of carbides of Group IVa, Va and VIa elements of Periodic Table except WC and 0.5 to 15 weight % of an iron group metal by maintaining it in an atmosphere of $N_2$ or CO at a pressure of 10 to 760 Torr and a temperature of 900 to 1500° C. for 0.5 to 3 hours and cooling in $N_2$, CO, an inert gas or vacuum to room temperature, ② a step of chemical treatment for dissolving and removing the iron group metal coming out of the surface with the formation of microscopic protrusions by the heat treatment, ③ a step of coating treatment for coating the surface of substrate after the chemical treatment, having microscopic protrusions, with polycrystalline diamond by a gaseous phase synthesis method and ④ a step of polishing the surface of the coated polycrystalline diamond by polishing working to yield a mirror surface state.

(4) A process for the production of a high strength bonding tool comprising at least the following steps ① to ⑤, being in order carried out:

① a step of heat treatment for forming microscopic protrusions of hard carbides and/or hard carbonitrides on a cemented carbide having a coefficient of linear expansion of $4.0 \times 10^{-6}$ to $5.5 \times 10^{-6}/°$ C. at room temperature to 400° C., being composed of, as a hard phase, at least one member selected from the group consisting of carbides of Group IVa, Va and VIa elements of Periodic Table and solid solutions thereof, and having a composition of 70 to 95 weight % of WC, 2 to 25 weight % of carbides of Group IVa, Va and VIa elements of Periodic Table except W and 0.5 to 15 weight % of an iron group metal by maintaining it in an atmosphere of $N_2$ or CO at a pressure of 10 to 760 Torr and a temperature of 900 to 1500° C. for 0.5 to 3 hours and cooling in $N_2$, CO, an inert gas or vacuum to room temperature, ② a step of chemical treatment for dissolving and removing the iron group metal coming out of the surface with the formation of microscopic protrusions by the heat treatment, ③ a step of coating treatment for coating the surface of substrate after the chemical treatment, having microscopic protrusions, with polycrystalline diamond by a gaseous phase synthesis method and ④ a step of using the polycrystalline diamond-coated cemented carbide as a tool material, arranging it in such a manner that the polycrystalline diamond-coated surface be the tool end surface, bonding the tool material with a shank consisting of at least one member selected from the group consisting of metals, alloys and cemented carbides having a coefficient of linear expansion of $4.0 \times 10^{-6}$ to $5.5 \times 10^{-6}/°$ C. at room temperature to 400° C. by the use of a bonding metal with a melting point of 650 to 1200° C. and (5) a step of polishing the surface of the coated polycrystalline diamond at the end of the bonded body by polishing working to yield a mirror surface state.

The first main embodiment of the present invention further includes the following embodiments (5) to (19):

(5) The high strength bonding tool as described in the foregoing (1) or (2), wherein the microscopic protrusions composed of hard carbides and/or hard carbonitrides on the cemented carbide surface penetrate into the polycrystalline diamond layer coated on the surface.

(6) The high strength bonding tool as described in the foregoing (1), (2) or (5), wherein the microscopic protrusions composed of hard carbides and/or hard carbonitrides on the cemented carbide surface have a length of 2 to 10 µm.

(7) The high strength bonding tool as described in the foregoing (1), (2), (5) or (6), wherein the cemented carbide making up the substrate coated with polycrystalline diamond comprises a hard phase composed of at least one member selected from the group consisting of carbides of Group IVa, Va and VIa elements of Periodic Table and solid solutions thereof and has a composition of 70 to 95 weight % of WC, 2 to 25 weight % of carbides of Group IVa, Va and VIa elements of Periodic Table except W and 0.5 to 15 weight % of an iron group metal and a thermal conductivity of 40 to 120 W/m.K.

(8) The high strength bonding tool as described in the foregoing (1), (2), (5), (6) or (7), wherein the thickness of the coated polycrystalline diamond is 15 to 100 µm.

(9) The high strength bonding tool as described in the foregoing (1), (2), (5), (6), (7) or (8), wherein the purity of the coated polycrystalline diamond is represented by a peak ratio (Y/X) of diamond carbon (X) and non-diamond carbon (Y) is at most 0.2 by Raman spectroscopic analysis.

(10) The high strength bonding tool as described in the foregoing (2), (5), (6), (7), (8) or (9), wherein a part or whole of the shank consists of cemented carbides, Mo, W, Cu—W alloy, Cu—Mo alloy, W—Ni alloy, Kovar alloy and Invar alloy.

(11) The high strength bonding tool as described in the foregoing (2), (5), (6), (7), (8), (9) or (10), wherein the tool material and shank are bonded through a bonding metal having a melting point of 650 to 1200° C.

(12) The high strength bonding tool as described in the foregoing (1), (2), (5), (6), (7), (8), (9), (10) or (11), wherein the surface roughness of the polycrystalline diamond coated surface is represented by Rmax of at most 0.1 µm.

(13) The high strength bonding tool as described in the foregoing (1), (2), (5), (6), (7), (8), (9), (10), (11) or (12), wherein the coated polycrystalline diamond is orientated in (100) plane and/or (110) plane in the thickness direction.

(14) The process for the production of a high strength bonding tool, as described in the foregoing (3) or (4), wherein the thickness of the coated polycrystalline diamond is 15 to 100 µm.

(15) The process for the production of a high strength bonding tool, as described in the foregoing (3), (4) or (14), wherein the purity of the coated polycrystalline diamond is represented by a peak ratio (Y/X) of diamond carbon (X) and non-diamond carbon (Y) is at most 0.2 by Raman spectroscopic analysis.

(16) The process for the production of a high strength bonding tool, as described in the foregoing (4), (14) or (15), wherein a part or whole of the shank consists of cemented carbides, Mo, W, Cu—W alloy, Cu—Mo alloy, W—Ni alloy, Kovar alloy and Invar alloy.

(17) The process for the production of a high strength bonding tool, as described in the foregoing (4), (14), (15) or (16), wherein the tool material and shank are bonded through a bonding metal having a melting point of 650 to 1200° C.

(18) The process for the production of a high strength bonding tool, as described in the foregoing (3), (4), (14), (15), (16) or (17), wherein the surface roughness of the polycrystalline diamond coated surface is represented by Rmax of at most 0.1 µm.

(19) The process for the production of a high strength bonding tool, as described in the foregoing (3), (4), (14), (15), (16), (17) or (18), wherein the the coated polycrystalline diamond is orientated in (100) plane and/or (110) plane in the thickness direction.

The second main embodiments of the present invention are a mounting tool, a process for the production of the same and a mounting method, having the following features (1) to (5):

(1) A mounting tool used for heating, melting and bonding, or thermocompression bonding a workpiece to be bonded, having a rectangular surface to be a pressing surface consisting of a polycrystalline diamond formed by a gaseous phase synthesis method, the surface being under a mirror surface state with a surface roughness of at most 0.1 µm by Rmax representation and such a property that when the temperature at the central part of the pressing surface is in the range of 200 to 400° C., the flatness in the longitudinal direction is at most 3 µm and the maximum temperature gradient in the pressing surface is at most 10° C.

(2) A mounting tool used for heating, melting and bonding, or thermocompression bonding a workpiece to be bonded, comprising a substrate consisting of a cemented carbide having microscopic protrusions of hard carbides and/or hard carbonitrides on at least one surface, having a rectangular surface to be a pressing surface and a coefficient of linear expansion of $4.0 \times 10^{-6}$ to $5.5 \times 10^{-6}/°$ C. at room temperature to 400° C. and a polycrystalline diamond coating formed on the above described surface having microscopic protrusions by a gaseous phase synthesis method, the surface coated with the polycrystalline diamond coating having a mirror surface with a surface roughness of at most 0.1 µm by Rmax representation and such a property that when the temperature at the central part of the pressing surface is in the range of 200 to 400° C., the flatness in the longitudinal direction is at most 3 µm and the maximum temperature gradient in the pressing surface is at most 10° C.

(3) A process for the production of a mounting tool, comprising coating polycrystalline diamond onto a rectangular surface of the tool to be the pressing surface when a workpiece to be bonded is subjected to heating, melting and bonding, or thermocompression bonding, controlling the temperature at the central part of the tool to be the same as that of the application temperature of the tool within a temperature range of 200 to 400° C., and polishing the surface to obtain a mirror surface with a surface roughness of at most 0.1 µm by Rmax representation and such a property that when the temperature at the central part of the pressing surface is in the range of 200 to 400° C., the flatness in the longitudinal direction of the pressing surface at the application temperature is at most 3µ and to obtain a mirror surface with a surface roughness of at most 0.1 μm by Rmax representation surface.

(4) A mounting method comprising always heating directly or indirectly a high precision mounting tool at a temperature range of 200 to 400° C., pressing it to a workpiece to be bonded and subjecting to heating, melting and bonding, or thermocompression bonding, the high precision mounting tool comprising a rectangular pressing surface consisting of polycrystalline diamond and having a mirror surface with a surface roughness of at most 0.1 μm by Rmax representation and such a property that when the temperature at the central part of the pressing surface is in the range of 200 to 400° C., the flatness in the longitudinal direction is at most 3 μm and the maximum temperature gradient in the pressing surface is at most 10° C.

(5) A mounting method comprising always heating directly or indirectly a high precision mounting tool at a temperature range of 200 to 400° C., during which it is pressed to a workpiece to be bonded for a predetermined time, then cooling the tool to at most 200° C., releasing the pressing of the workpiece and subjecting to heating, melting and bonding, or thermocompression bonding, the high precision mounting tool comprising a rectangular pressing surface consisting of polycrystalline diamond and having a mirror surface with a surface roughness of at most 0.1 μm by Rmax representation and such a property that when the temperature at the central part of the pressing surface is in the range of 200 to 400° C., the flatness in the longitudinal direction is at most 3 μm and the maximum temperature gradient in the pressing surface is at most 10° C.

The third main embodiments of the present invention are a mounting tool, a process for the production of the same and a mounting method, having the following features (1) to (4):

(1) A mounting tool comprising a rectangular frame-shaped hollow square frustum, having an end surface to be a pressing surface, the rectangular frame-shaped end surface consisting of a polycrystalline diamond formed by a gaseous phase synthesis method, the surface being of a mirror surface with a surface roughness of at most 0.1 μm by Rmax representation and having such a property that the maximum temperature gradient in the pressing surface is at most 20° C.

(2) A mounting tool comprising a substrate consisting of a cemented carbide having microscopic protrusions of hard carbides and/or hard carbonitrides on at least one surface, having a rectangular frame-shaped end surface of a hollow square frustum, to be a pressing surface and a coefficient of linear expansion of $4.0 \times 10^{-6}$ to $5.5 \times 10^{-6}/°$ C. at room temperature to 400° C. and a polycrystalline diamond coating formed on the above described surface having microscopic protrusions by a gaseous phase synthesis method, the surface coated with the polycrystalline diamond coating having a mirror surface with a surface roughness of at most 0.1 μm by Rmax representation and such a property that the maximum temperature gradient in the pressing surface is at most 20° C.

(3) A process for the production of a mounting tool, comprising coating polycrystalline diamond onto a rectangular frame-shaped end surface of a hollow square frustum, to be a pressing surface, and polishing the surface in such a manner that the flatness of the pressing surface at the application temperature is at most 3μ and a mirror surface with a surface roughness of at most 0.1 μm by Rmax representation is obtained, while controlling the maximum temperature of the pressing surface so as to be same as that of the application temperature of the tool within a temperature range of 220 to 600° C.

(4) A mounting method comprising always heating directly or indirectly a part mounting tool at a temperature range of 200 to 600° C., pressing it to a workpiece to be bonded and subjecting to heating, melting and bonding, or thermocompression bonding, the part mounting tool comprising a rectangular frame-shaped end surface of a hollow square frustum, to be a pressing surface, the rectangular frame-shaped end surface consisting of polycrystalline diamond formed by a gaseous phase method and having a mirror surface with a surface roughness of at most 0.1 μm by Rmax representation and with such a property that when the maximum temperature of the pressing surface is in the range of 220 to 600° C., the flatness of the pressing surface is at most 3 μm and the maximum temperature gradient in the pressing surface is at most 20° C.

(5) A mounting method comprising always heating directly or indirectly a part mounting tool at a temperature range of 200 to 600° C., during which it is pressed to a workpiece to be bonded for a predetermined time, then cooling the tool to at most 200° C., releasing the pressing of the workpiece and subjecting to heating, melting and bonding, or thermocompression bonding, the part mounting tool comprising a rectangular frame-shaped end surface of a hollow square frustum, to be a pressing surface, the rectangular frame-shaped end surface consisting of polycrystalline diamond formed by a gaseous phase method and having a mirror surface with a surface roughness of at most 0.1 μm by Rmax representation and with such a property that when the maximum temperature of the pressing surface is in the range of 220 to 600° C., the flatness of the pressing surface is at most 3 μm and the maximum temperature gradient in the pressing surface is at most 20° C.

The fourth main embodiments of the present invention are a mounting tool, a process for the production of the same and a mounting method, having the following features (1) to (4):

(1) A tool used for directly mounting LSI on a substrate by a flip chip method, comprising a pressing surface of a tool end, the pressing surface consisting of polycrystalline diamond formed by a gaseous phase synthesis method, the pressing surface being of a mirror surface with a surface roughness of at most 0.1 μm by Rmax representation, having at least one vacuum adsorption hole made in the surface and having such a property that when the maximum temperature of the pressing surface is in the range of 230 to 400° C., the flatness of the pressing surface is at most 5 μm and the maximum temperature gradient in the pressing surface is at most 30° C.

(2) A flip chip mounting tool comprising a substrate consisting of a cemented carbide having microscopic protrusions of hard carbides and/or hard carbonitrides on at least one surface, having a pressing surface at the tool end and a coefficient of linear expansion of $4.0 \times 10^{-6}$ to $5.5 \times 10^{-6}/°$ C. at room temperature to 400° C., and a polycrystalline diamond coating formed on the above described surface having microscopic protrusions by a gaseous phase synthesis method, the surface coated with the polycrystalline diamond coating having a mirror surface with a surface roughness of at most 0.1 μm by Rmax representation, having at least one vacuum adsorption hole made in the surface and having such a property that when the maximum temperature of the pressing surface is in the range of 230 to 400° C., the flatness of the pressing surface is at most 5 μm and the maximum temperature gradient in the pressing surface is at most 30° C.

(3) A process for the production of a flip chip mounting tool, comprising at least steps of coating polycrystalline diamond onto a tool end surface to be a pressing surface during mounting and polishing the surface in such a manner that when the maximum temperature of the pressing surface is in the range of 230 to 400° C., the flatness of the pressing surface at the application temperature of the tool is at most 5μ and the surface is under a mirror state with a surface roughness of at most 0.1 μm by Rmax representation, while controlling the maximum temperature of the pressing surface so as to be same as that of the application temperature of the tool within a temperature range of 200 to 400° C.

(4) A flip chip mounting method comprising always heating directly or indirectly a mounting tool at a temperature range of 200 to 400° C., transporting LSI by adsorption in vacuum, pressing it for a predetermined time and thus mounting it on a substrate through a binding material, the mounting tool having a pressing surface consisting of polycrystalline diamond formed by a gaseous phase method and being under a mirror state with a surface roughness of at most 0.1 μm by Rmax representation and with such a property that when the maximum temperature of the pressing surface is in the range of 230 to 400° C., the flatness of the pressing surface is at most 5 μm and the maximum temperature gradient in the pressing surface is at most 30° C.

(5) A flip chip mounting method comprising always heating directly or indirectly a mounting tool at a temperature range of 200 to 400° C., during which LSI is adsorbed in vacuum and transported, and then subjected to pressing for a predetermined time, cooling the tool to at most 200° C., releasing the pressing of the workpiece and thus mounting it on a substrate through a binding material, the mounting tool having a pressing surface consisting of polycrystalline diamond formed by a gaseous phase method and being under a mirror state with a surface roughness of at most 0.1 μm by Rmax representation and with such a property that when the maximum temperature of the pressing surface is in the range of 230 to 400° C., the flatness of the pressing surface is at most 5 μm and the maximum temperature gradient in the pressing surface is at most 30° C.

The fifth main embodiments of the present invention are a pulse heating tool and a process for the production of the same, having the following features (1) to (4):

(1) A pulse heating tool comprising a tool end part and a shank, bonded with each other by a brazing material, in which the side of the tool including the exposed brazing material surface except a machine-fitting part is coated with a metal or ceramics with a low reactivity with the melted solder.

(2) A process for the production of a pulse heating tool, which comprises brazing a tool end part and a shank with a brazing material and coating the side of the tool including the exposed brazing material surface except a machine-fitting part with a metal or ceramics with a low reactivity with the melted solder.

These fifth main embodiments include the following embodiments (3) to (18):

(3) The pulse heating tool, as described in the foregoing (1), wherein the coated metal is at least one member selected from the group consisting of Cr, Mo, W, Ni, Pd and Pt.

(4) The pulse heating tool, as described in the foregoing (1), wherein the coated ceramics is at least one member selected from the group consisting of $Al_2O_3$, $SiO_2$, $ZrO_2$ and $TiO_2$.

(5) The pulse heating tool, as described in the foregoing (1), (3) or (4), wherein the coating thickness is in the range of 1 to 100 μm.

(6) The pulse heating tool, as described in the foregoing (1), (3), (4) or (5), wherein the tool end part consists of a cemented carbide coated with polycrystalline diamond.

(7) The pulse heating tool, as described in the foregoing (1), (3), (4), (5) or (6), wherein the shank is of at least one member selected from the group consisting of Mo and W.

(8) The pulse heating tool, as described in the foregoing (1), (3), (4), (5), (6) or (7), wherein the brazing material consists predominantly of any one of Cu, Ag and Au, each having a melting point of 650 to 1200° C.

(9) The process for the production of a pulse heating tool, as described in the foregoing (2), wherein the coated metal is at least one member selected from the group consisting of Cr, Mo, W, Ni, Pd and Pt.

(10) The process for the production of a pulse heating tool, as described in the foregoing (2) or (9), wherein the coated ceramics is at least one member selected from the group consisting of $Al_2O_3$, $SiO_2$, $ZrO_2$ and $TiO_2$.

(11) The process for the production of a pulse heating tool, as described in the foregoing (2), (9) or (10), wherein the coating thickness is in the range of 1 to 100 μm.

(12) The process for the production of a pulse heating tool, as described in the foregoing (2), (9), (10) or (11), wherein the tool end part consists of a cemented carbide coated with polycrystalline diamond.

(13) The process for the production of a pulse heating tool, as described in the foregoing (2), (9), (10), (11) or (12), wherein the shank is of at least one member selected from the group consisting of Mo and W.

(14) The process for the production of a pulse heating tool, as described in the foregoing (2), (9), (10), (11), (12) or (13), wherein the brazing material consists predominantly of any one of Cu, Ag and Au, each having a melting point of 650 to 1200° C.

(15) The process for the production of a pulse heating tool, as described in the foregoing (2), (9), (11), (12), (13) or (14), wherein the coating of a metal is carried out by any one of plating methods, PVD methods and CVD methods.

(16) The process for the production of a pulse heating tool, as described in the foregoing (2), (10), (11), (12), (13) or (14), wherein the coating of a cermics is carried out by any one of PVD methods, CVD methods and hydrolysis methods of metal alkoxides.

(17) The pulse heating tool, as described in the foregoing (8), wherein the brazing material contains Ti, Sn, In or Ni in addition to the predominant component.

(18) The process for the production of a pulse heating tool, as described in the foregoing (14), wherein the brazing material contains Ti, Sn, In or Ni in addition to the predominant component.

In the bonding tool of the first embodiment according to the present invention, as a substrate to be coated with polycrystalline diamond, there is used a cemented carbide having microscopic protrusions of hard carbides and/or hard carbonitrides on at least one surface and a coefficient of linear expansion of $4.0 \times 10^{-6}$ to $5.5 \times 10^{-6}$/° C. at room temperature to 400° C.

When a surface of such a substrate, to be the end surface of the above described tool, is coated with polycrystalline diamond as illustrated hereinafter, a bonding tool material can be obtained having a high bonding strength between the coated polycrystalline diamond and substrate and being excellent in strength as well as heat response.

The reason for the improvement of the bonding strength when using such a substrate is that the cemented carbide surface having microscopic protrusions is coated with polycrystalline diamond and the stripping resistance is thus increased by the so-called anchor effect. Furthermore, the thermal stress due to a difference of thermal expansions between the coated polycrystalline diamond and substrate can be minimized by specifying the coefficient of linear expansion of the cemented carbide in $4.0 \times 10^{-6}$ to $5.5 \times 10^{-6}/°$ C. at room temperature to 400° C., whereby the excellent bonding strength can be maintained even at a high temperature at which the bonding tool is used.

The composition of the cemented carbide as a substrate can specifically be expressed by a hard phase composed of at least one of carbides and carbonitrides of Group IVa, Va and VIa elements of Periodic Table and solid solutions thereof, and a binder phase, e.g. comprising 70 to 95 weight % of WC, 2 to 25 weight % of carbides of Group IVa, Va and VIa elements of Periodic Table, other than WC, and 0.5 to 15 weight % of an iron group metal. In this composition range, the microscopic protrusions of the hard carbides and/or hard carbonitrides can be formed by a heat treatment illustrated hereinafter to effectively yield the anchor effect.

When using the cemented carbide having this composition range, the coefficient of linear expansion can readily be controlled in a range of $4.0 \times 10^{-6}$ to $5.5 \times 10^{-6}/°$ C. at room temperature to 400° C. As the iron group metal to be added, it is preferable to use, in particular, Co from the stand-point of the wetting property with the hard carbides, having an influence upon the sintering property.

In addition, it is important to adjust the thermal conductivity to 40 to 120 W/m.K at 400° C., since the lower limit, 40 W/m.K is a critical value required for giving a good heat response in the case of applying to the pulse heating tool and the upper limit, 120 W/m.K is the highest value of the thermal conductivities the cemented carbides having the above described composition range have.

The microscopic protrusions composed of the hard carbides and/or hard carbonitrides on the surface of the cemented carbide after the heat treatment have preferably a protrusion length of 2 to 10 μm, if shorter than 2 μm, no marked anchor effect is given and if longer than 10 μm, polycrystalline diamond is hard to be formed among the protrusions during coating the polycrystalline diamond in the subsequent step and reversely, a high bonding strength cannot be obtained.

The substrate having the microscopic protrusions of the hard carbides and/or hard carbonitrides on the surface thereof can be prepared by subjecting a substrate having a coefficient of linear expansion of $4.0 \times 10^{-6}$ to $5.5 \times 10^{-6}/°$ C. at room temperature to 400° C., being composed of a hard phase of carbides of Group IVa, Va and VIa elements of Periodic Table and/or solid solutions thereof and comprising 70 to 95 weight % of WC, 2 to 25 weight % of carbides of Group IVa, Va and VIa elements of Periodic Table, other than WC, and 0.5 to 15 weight % of an iron group metal to a heat treatment in an atmosphere of $N_2$ or CO of 10 to 760 Torr at a temperature of 900 to 1500° C. for 0.5 to 3 hours, and cooling to room temperature in an atmosphere of $N_2$, CO or an inert gas of 10 to 760 Torr or in a vacuum of at most 12 Torr. By this treatment, the carbides of Group IVa, Va and VIa elements of Periodic Table as the components for making up the cemented carbide are moved toward the surface of the cemented carbide, further recrystallized and grown in microscopic protrusions. The microscopic protrusions are partly nitrided, in some cases, depending on the heating atmosphere to finally result in carbonitrides or a mixed phase of carbides and carbonitrides, which exhibit the similar good bonding strength to the case of only carbides.

When the pressure and gaseous atmosphere of the above described heating conditions are outside the above specified ranges, the microscopic protrusions of the hard carbides and/or hard carbonitrides are not formed or the length thereof is not within the above described range, some times. This is not preferable. The reason for specifying the heating temperature and retention time is that at a temperature of lower than 900° C. or for a retention time of shorter than 0.5 hour, the carbides of Group IVa, Va and VIa elements of Periodic Table are hard to be moved and the formation of the protrusions is not sufficient, while at a temperature of higher than 1500° C. or for a retention time of longer than 3 hours, the grain growth of the hard carbides and/or hard carbonitrides on the surface is remarkable, resulting in lowering of the strength, which should be avoided.

The iron group metal, as the binder material for the cemented carbide, also comes out of the surface with the formation of the microscopic protrusions by the above described heat treatment. This iron group metal does not act as the binder material of the cemented carbide, but rather exhibits an action of converting the deposited diamond into graphite in the step of coating polycrystalline diamond, illustrated hereinafter. Thus, it is required to remove the iron group metal before the coating step. For the removal of the iron group metal on the surface is preferable a method comprising immersing the cemented carbide after the heat treatment in an acid for dissolving the metal. The acid which can effectively be used to this end includes hydrochloric acid, nitric acid, etc. or mixed acids thereof, capable of not dissolving the carbides or carbonitrides, but dissolving only the iron group metals. The dissolving treatment can be carried out even at room temperature, but can more effectively be carried out by heating under pressure. Since the microscopic protrusions formed by the heat treatment of the cemented carbide according to the present invention are formed in a laminar form to completely cover the surface of the cemented carbide, the acid having dissolved the iron group metal on the surface does not more permeate inward to dissolve the iron group metal as the binder material of the cemented carbide.

The thus surface-modified cemented carbide is used as a substrate and the surface having the microscopic protrusions to become a tool end surface is coated with polycrystalline diamond. As the gaseous phase synthesis method for coating polycrystalline diamond, any known method is available, for example, various CVD (Chemical Vapor Deposition) methods for causing cracking and exciting of raw material gases utilizing plasma discharge or thermoelectronic emission. As the raw material gases, there are generally used mixed gases of materials containing carbon as constitutional elements, for example, organo carbon-containing compounds, i.e. hydrocarbons such as methane, ethane, propane and the like; alcohols such as methanol, ethanol and the like; and esters with hydrogen gas. In addition to hydrogen, inert gases such as argon or oxygen, carbon monoxide, water, etc. can be added in such a quantity not as hindering the reaction of forming diamond.

The coating thickness of polycrystalline diamond is preferably in the range of 15 to 100 μm. Since the length of the microscopic protrusion on the surface of the cemented carbide is preferably in the range of 2 to 10 μm, the minimum value of the coating thickness, i.e. 15 μm is determined in anticipation of a margin that the longest protrusion is completely covered and a mirror state is attained in the subsequent polishing step. The reason for the limitation of the maximum value to 100 μm is that if more than 100 μm, the thermal stress due to a difference in thermal expansions between the substrate and coated polycrystalline diamond becomes remarkable and the benefit of improvement of the bonding strength by the anchor effect is decreased.

The purity of the polycrystalline diamond is preferably represented by a peak ratio (Y/X) of at most 0.2 wherein X represents diamond carbon and Y represents non-diamond carbon. Unless such a high purity film quality is used, the thermal deterioration of the tool end surface during use is too large to maintain a long service life.

The interface between the cemented carbide surface and coated polycrystalline diamond can, in detail, be expressed by "the microscopic protrusions on the cemented carbide surface enter into the polycrystalline diamond layer". According to the substrate formulation of the present invention, coating to give such a cross-sectional structure can be carried out and the anchor effect can effectively be realized.

After coating polycrystalline diamond, the coated surface is converted into a mirror surface state and used as a tool end surface or tool pressing surface. In this specification, the mirror surface state means a state with a surface roughness of at most 0.1 $\mu$m by Rmax representation. Working of this surface can be carried out by polishing it using a grindstone, which has generally been employed as a method of working sintered diamond or polycrystalline diamond by a gaseous phase synthesis method.

In this step, in particular, orientation of the polycrystalline diamond in (100) plane and/or (110) plane in the thickness direction is preferable for increasing the working efficiency of this mirror surface working.

The polycrystalline diamond-coated cemented carbide obtained in this way can be used as a bonding tool as it is or after working a part of the cemented carbide in a desired shape.

Furthermore, this polycrystalline diamond-coated cemented carbide can be used as a tool material, for example, in such a structure as being bonded with a specified shank. In this case, it is required that the shank material consists of at least one member selected from the group consisting of metals, alloys and cemented carbides each having a coefficient of linear expansion of $4.0 \times 10^{-6}$ to $5.5 \times 10^{-6}/°$ C. at room temperature to 400° C. This is specified for the purpose of suppressing the thermal stress due to a difference in thermal expansion from the tool material as little as possible. Specifically, the shank material is selected from the group consisting of cemented carbides, Mo, W, Cu—W alloys, Cu—Mo alloys, W—Ni alloys, Kovar alloys and Invar alloys.

Kovar is a ferrous alloy of a low coefficient of thermal expansion, having a composition comprising, by weight, 64% Fe-29% Ni-17% Co and at most 0.5% of microamount elements such as Mn, Si, Mg, Zr, C, Al, Ti, etc.

Invar is a similar ferrous alloy of a low coefficient of thermal expansion, having a composition comprising, by weight, 63.5% Fe-36.5% Ni (so-called 36 Invar) or 64% Fe-31% Ni-5% Co (so-called Super Invar). Super Invar contains about 0.3 to 0.4% of Mn and about 0.07% of C in addition to the above described components.

Bonding of the tool material with a shank can be carried out by any known methods. In particular, a method of bonding through a bonding metal having a melting point of 650 to 1200° C. is effective. Specifically, brazing with a brazing agent having a melting point within this temperature range or thermocompression with Au can be utilized for this purpose. As the brazing agent, there are used those containing, as predominant components, at least one element selected from the group consisting of Au, Ag, Cu, Pt, Pd and Ni, and other elements in such an amount that the property of the brazing agent is not deteriorated. In the case of the thermocompression with Au, at least one layer of metallic thin films of Ti, Pt, Au, Ni, Mo, etc. is preferably applied previously to the bonding surface of the tool material and shank. This previous coating treatment serves to increase the thermocompression strength of Au.

The reason for specifying the lower limit of the melting point of the bonding metal to 650° C. is that thermal deformation or thermal deterioration of the brazed layer is hard to occur when the tool is heated and used. The upper limit, 1200° C. is specified based on the knowledge that when the bonding is carried out at a temperature of higher than 1200° C., there is a large possibility in thermal deterioration of polycrystalline diamond.

For the practice of the second main embodiment of the present invention, it is indispensable that the tool end part has a rectangular surface to be a pressing surface during mounting and consists of polycrystalline diamond by a gaseous phase method. Namely, the polycrystalline diamond by a gaseous phase method is excellent in heat resistance and wear resistance, free from the restriction on the size to be produced and can be produced with a low cost.

For satisfying the requirements of the market, it is required that the surface of the polycrystalline diamond is under a mirror surface state with a surface roughness of at most 0.1 $\mu$m by Rmax representation and such a property that when the temperature at the central part of the pressing surface is in the range of 200 to 400° C., the flatness in the longitudinal direction is at most 3 $\mu$m and the maximum temperature gradient in the pressing surface is at most 10° C. Particularly, the mounting efficiency can be increased by adjusting the length of the pressing surface in the longitudinal direction to 100 to 400 mm.

For the production of the above described tool, it is preferable to select the same tool structure as that of the first embodiment, i.e. the structure obtained by directly coating a shank made of the specific cemented carbide with polycrystalline diamond or by coating the specific cemented carbide substrate with polycrystalline diamond and then bonding the polycrystalline diamond-coated cemented carbide to a shank of a metal or alloy by brazing. The latter structure, in particular, is a more preferable structure because of increasing the degree of freedom concerning the workability of the shank or tool property.

As the cemented carbide to be coated with polycrystalline diamond, there is used a cemented carbide having microscopic protrusions of hard carbides and/or hard carbonitrides on at least one surface to be the coating surface and having a coefficient of linear expansion of $4.0 \times 10^{-6}$ to $5.5 \times 10^{-6}/°$ C. When such a substrate is coated with polycrystalline diamond in the similar manner to in the first embodiment of the present invention, a tool material having a high bonding strength between the substrate and coated polycrystalline diamond and excellent strength and thermal response can be realized.

After coating polycrystalline diamond, the coated surface is converted into a mirror surface state and used as a tool end surface or tool pressing surface. In this second embodiment of the present invention, the mirror surface state also means a state with a surface roughness of at most 0.1 $\mu$m by Rmax representation. Working of this surface can be carried out by polishing it using a grindstone, which has generally been employed as a method of working sintered diamond or polycrystalline diamond by a gaseous phase synthesis method. However, it is required that when the temperature of the central part of the pressing surface is maintained in the range of 200 to 400° C., as the general tool operation condition, polishing is carried out to give a flatness of at most 3 μm. As a means for this purpose, for example, polishing is carried out while controlling the temperature of the central part of the pressing surface to be same as the tool operation temperature in the range of 200 to 400° C. When the length of the tool pressing surface in the longitudinal direction is 100 to 400 mm, in particular, it is required that the flatness of a grindstone itself or polishing working jig is previously maintained under a good state.

The subsequent procedures for processing or finishing the bonding tool are substantially the same as those for the first main embodiment of the present invention.

Polishing of the tool surface is preferably carried out after bonding of the tool material with a shank in view of the precision to be maintained and the above described polishing method is available.

Figure 7:
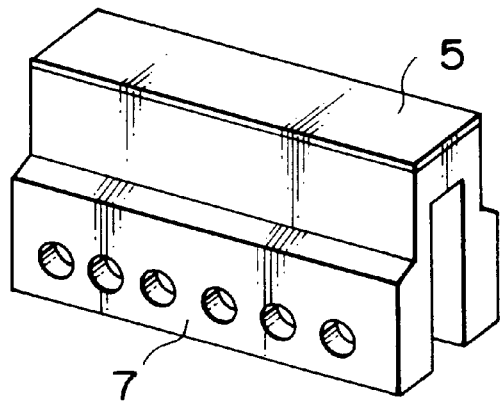
FIG. 7 is a schematic view of a still further embodiment of the bonding tool of the present invention, having such a design that polycrystalline diamond is directly coated onto a shank to yield a precision property.

The tool prepared by the above described method, having a pressing surface composed of polycrystalline diamond, is capable of exhibiting such a good property that the maximum temperature gradient in the pressing surface is at most 10° C. in the temperature range of 200 to 400° C. When designing of the shank is as shown in FIG. 7, in particular, the tool is more excellent in temperature distribution and flatness.

When mounting of parts is carried out using this tool by the constant heating system or pulse heating system, the mounting can be accomplished in uniform or highly efficient manner.

For the practice of the third main embodiment of the present invention, it is indispensable that the tool end part has a rectangular frame-shaped hollow square frustum, with an end surface to be a pressing surface, and consists of polycrystalline diamond by a gaseous phase method. Namely, the polycrystalline diamond by a gaseous phase method is excellent in heat resistance and wear resistance, free from the restriction on the shape to be produced and can be produced with a low cost.

For satisfying the requirements of the market, it is required that the surface of the polycrystalline diamond is under a mirror surface state with a surface roughness of at most 0.1 μm by Rmax representation and such a property that when the temperature at the central part of the pressing surface is in the range of 220 to 600° C., the flatness in the longitudinal direction is at most 3 μm and the maximum temperature gradient in the pressing surface is at most 20° C.

For the production of the above described tool, as described in Japanese Patent Laid-Open Publication No. 224349/1990, it is effective to use a sintered body consisting predominantly of $Si_3N_4$ or SiC as a substrate and to coat the surface thereof with polycrystalline diamond, followed by applying to a tool end part. In this case, however, the strength of the ceramic substrate is sometimes insufficient.

When a tool having a high strength and good thermal response is desired, it is preferable to select the same tool structure as that of the first embodiment, i.e. the structure obtained by directly coating a shank made of the specific cemented carbide with polycrystalline diamond or by coating the specific cemented carbide substrate with polycrystalline diamond and then bonding the polycrystalline diamond-coated cemented carbide to a shank of a metal or alloy by brazing, etc. The latter structure, in particular, is a more preferable structure because of increasing the degree of freedom concerning the workability of the shank or tool property.

As the cemented carbide to be coated with polycrystalline diamond, there is used a cemented carbide having microscopic protrusions of hard carbides and/or hard carbonitrides on at least one surface to be the coating surface and having a coefficient of linear expansion of $4.0 \times 10^{-6}$ to $5.5 \times 10^{-6}$/° C. When this cemented carbide is worked in a final shape of a tool end part or a similar shape thereto, a tool production is rendered possible through much easier working steps as compared with the tool production using sintered diamond as a material. When such a substrate is coated with polycrystalline diamond in the similar manner to in the first embodiment of the present invention, a tool material having a high bonding strength between the substrate and coated polycrystalline diamond and excellent strength and thermal response can be realized.

The subsequent procedures for processing or finishing the bonding tool are substantially the same as those for the first main embodiment of the present invention.

After coating polycrystalline diamond, the coated surface is converted into a mirror surface state and used as a tool end surface or tool pressing surface. In this third embodiment of the present invention, the mirror surface state also means a state with a surface roughness of at most 0.1 μm by Rmax representation. Working of this surface can be carried out by polishing it using a grindstone, which has generally been employed as a method of working sintered diamond or polycrystalline diamond by a gaseous phase synthesis method. However, it is required that while controlling the maximum temperature of the pressing surface to be same as the general tool operation temperature (200 to 600° C.), polishing is carried out to give a flatness of at most 3 μm at the operation temperature.

Bonding of the tool material with a shank can be carried out any one of known methods, but, in particular, a method comprising bonding through a bonding metal having a melting point of 800 to 1200° C. is effective. Specifically, brazing with a brazing agent having a melting point of within this temperature range can be utilized for this purpose. As the brazing agent, there are used those containing, as predominant components, at least one element elected from the group consisting of Au, Ag, Cu, Pt, Pd and Ni, and other elements in such an amount that the property of the brazing agent is not deteriorated.

The reason for specifying the lower limit of the melting point of the bonding metal to 800° C. is that thermal deformation or thermal deterioration of the brazed layer is hard to occur when the tool is heated and used. The upper limit, 1200° C. is specified based on the knowledge that when the bonding is carried out at a temperature of higher than 1200° C., there is a large possibility in thermal deterioration of polycrystalline diamond.

In the above described structure comprising the tool end part brazed with the specified shank, polishing working of the tool end part is carried out after the brazing.

The tool prepared by the above described method, having a pressing surface composed of polycrystalline diamond, is capable of exhibiting such a good property that the maximum temperature gradient in the pressing surface is at most 20° C. in the temperature range of 220 to 600° C.

Figure 8:
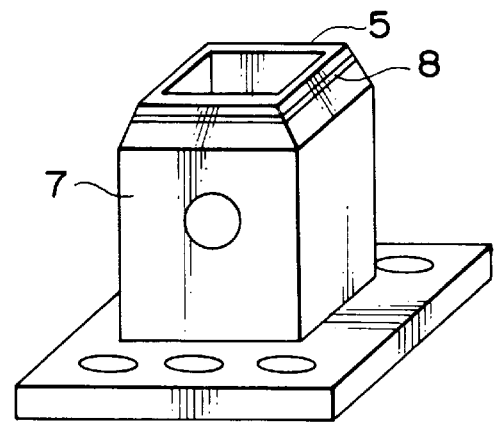
FIG. 8 is a schematic view of a still further embodiment of the bonding tool of the present invention, of such a type that the tool end part is bonded to a shank.

When mounting of parts is carried out using the tool structure of the above described bonded type, as shown in FIG. 8, by the constant heating system or pulse heating system, the mounting can be accomplished in uniform or highly efficient manner.

For the practice of the fourth main embodiment of the present invention, it is indispensable that the pressing surface for mounting, of the tool end part, consists of polycrystalline diamond by a gaseous phase method. Namely, the polycrystalline diamond by a gaseous phase method is excellent in heat resistance and wear resistance and can be produced with a low cost.

For satisfying the requirements of the market, it is required that the pressing surface of the tool end is composed of polycrystalline diamond by a gaseous phase method, having a surface roughness of at most 0.1 µm by Rmax representation and such a property that when the maximum temperature of the pressing surface is in the range of 230 to 400° C., the flatness of the pressing surface is at most 5 µm and the maximum temperature gradient in the pressing surface is at most 30° C.

For the production of the above described tool, it is preferable to select the same tool structure as that of the first embodiment, i.e. the structure obtained by directly coating a shank made of the specific cemented carbide with polycrystalline diamond or by coating the specific cemented carbide substrate with polycrystalline diamond and then bonding the polycrystalline diamond-coated cemented carbide to a shank of a metal or alloy by brazing.

In this embodiment, it is required to previously make a hole penetrating through a surface opposite to a surface to be coated with polycrystalline diamond, before the heat treatments similar to those of the other embodiments. This hole is provided to adsorb in vacuum LSI during mounting. If the provision of the hole is carried out after the heat treatment, the surface realized by the heat treatment is probably affected, which is unfavorable. After coating of polycrystalline diamond, the polycrystalline diamond is also damaged by the working of the hole.

The subsequent procedures for processing or finishing the bonding tool are substantially the same as those for the first main embodiment of the present invention.

After coating polycrystalline diamond, the coated surface is converted into a mirror surface state and used as a tool end surface or tool pressing surface. In this fourth embodiment of the present invention, the mirror surface state also means a state with a surface roughness of at most 0.1 µm by Rmax representation. Working of this surface can be carried out by polishing it using a grindstone, which has generally been employed as a method of working sintered diamond or polycrystalline diamond by a gaseous phase synthesis method. However, it is required that when the highest temperature of the pressing surface is maintained in the range of 230 to 400° C., as the general tool operation condition, polishing is carried out to give a flatness of at most 5 µm. As a means for this purpose, for example, polishing is carried out while controlling the temperature of the central part of the pressing surface to be same as the tool operation temperature in the range of 200 to 400° C.

Bonding of the tool material with a shank can be carried out by any known methods. In particular, a method of bonding through a bonding metal having a melting point of 650 to 1200° C. is effective. Specifically, brazing with a brazing agent having a melting point within this temperature range or thermocompression with Au can be utilized for this purpose. As the brazing agent, there are used those containing, as predominant components, at least one element selected from the group consisting of Au, Ag, Cu, Pt, Pd and Ni, and other elements in such an amount that the property of the brazing agent is not deteriorated. In the case of the thermocompression with Au, at least one layer of metallic thin films of Ti, Pt, Au, Ni, Mo, etc. is preferably applied previously to the bonding surface of the tool material and shank. This previous coating treatment serves to increase the thermocompression strength of Au.

The reason for specifying the lower limit of the melting point of the bonding metal to 650° C. is that thermal deformation or thermal deterioration of the brazed layer is hard to occur when the tool is heated and used. The upper limit, 1200° C. is specified based on the knowledge that when the bonding is carried out at a temperature of higher than 1200° C., there is a large possibility in thermal deterioration of polycrystalline diamond.

Polishing of the tool surface is preferably carried out after bonding of the tool material with a shank in view of the precision to be maintained and the above described polishing method is available.

Figure 12:
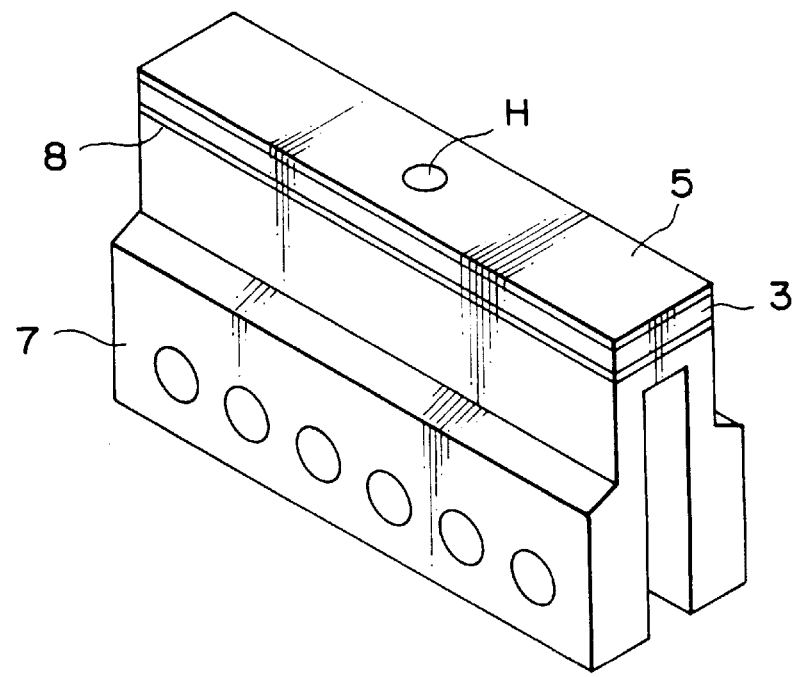
FIG. 12 is a schematic view of a still further embodiment of the bonding tool of the present invention, of such a type that the pressing surface is provided with a vacuum adsorption hole, used in Example 10.

The tool prepared by the above described method, having a pressing surface composed of polycrystalline diamond, is capable of exhibiting such a good property that the maximum temperature gradient in the pressing surface is at most 30° C. in the temperature range of 230 to 400° C. When designing of the shank is as shown in FIG. 12, in particular, the tool is more excellent in temperature distribution and flatness.

The pulse heating tool, as the fifth embodiment of the present invention, is an improved tool having a structure of a tool end part and shank bonded with each other by a brazing material. Namely, the side of the tool including the exposed brazing material surface except a machine-fitting part is coated with a metal or ceramics with a low reactivity with the melted solder.

As the tool end part, a cemented carbide coated with polycrystalline diamond, used in the first embodiment of the present invention, is also preferably used, since this material is excellent in properties required for the pulse heating tool, for example, thermal response, temperature distribution, durability etc. As the shank material, at least one member selected from the group consisting of Mo, W and alloys thereof is preferably used for the purpose of suppressing the thermal stress due to a difference in thermal expansion from the material making up the tool end part as little as possible.

Bonding of the tool end part with a shank can be carried out by any known methods. In particular, a method of bonding through a brazing material having a melting point of 650 to 1200° C. is effective. As the brazing material, there are used those containing, as predominant components, at least one element selected from the group consisting of Au, Ag, Cu and alloys thereof and other elements in such an amount that the property of the brazing material is not deteriorated. When using these brazing material, a high bonding strength can be realized represented by a shearing strength of 20 to 30 kg/mm$^2$.

In the fifth embodiment of the present invention, it is required that after the tool end part is brazed with a shank, the side of the tool including the exposed brazing material surface except a machine-fitting part is coated with a metal or ceramics with a low reactivity with the melted solder.

Figure 5:
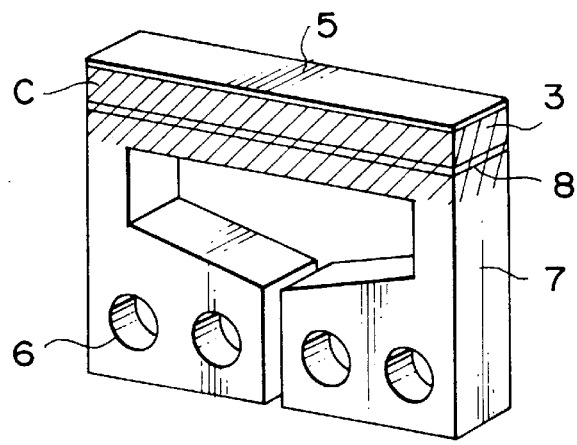
FIG. 5 is a schematic view of a pulse heating tool as shown in FIG. 4, which is subjected to a coating treatment according to the present invention.

Specifically, as shown in FIG. 5, the exposed surface of the brazing material, the side of the neighboring tool end and the side of the shank are coated with the metal or ceramics with a low reactivity with the melted solder. The coated range C may be beyond the range shown in FIG. 5, but the polycrystalline diamond-coated surface of the tool end 5 and the machine-fitting part 6 of the shank must not be coated. The coating of the tool end surface 5 does only deteriorate the property of the polycrystalline diamond, and does not result in any good function against prevention of the tool end part from falling off.

As to the machine-fitting part 6, moreover, when the coating material is ceramics having no electroconductivity, feeding from the machine is impossible and the coating only raises a new problem.

As the coating material, for example, there are used at least one member selected from the group consisting of Cr, Mo, W, Ni, Pd and Pt, and alloys thereof, and at least one member selected from the group consisting of $Al_2O_3$, $SiO_2$, $ZrO_2$ and $TiO_2$, and mixed oxides thereof. Since these materials have a low reactivity or a small diffusion coefficient for a melted solder, change of the solder composition can be prevented.

For the coating, any known methods are available. In a case where the coating material is a metal, for example, PVD (Physical Vapor Deposition) methods such as plating, sputtering, ion plating, etc. or CVD (Chemical Vapor Deposition) methods can be utilized. In the case of ceramics, coating by hydrolysis of a metal hydroxide is useful in addition to PVD or CVD methods.

For markedly realizing the coating effect, it is required that the coating thickness is in the range of 1 to 100 $\mu$m, since if less than 1 $\mu$m, the effect as a shielding layer is decreased, while if more than 100 $\mu$m, the bonding strength with the coated brazing material is so decreased that it tends to be stripped during use.

In the pulse heating tool prepared by these steps, the high bonding strength by a brazing material in applications by soldering can be maintained for a longer time as compared with the tool free from the coating treatment of the brazing material.

The high strength bonding tool and a process for the production of the same according to the present invention will now be illustrated in detail without limiting the same.

EXAMPLES

The surface roughness, flatness and largest temperature gradient, representative of the properties of the mounting tool of the present invention, were measured as follows:

Surface Roughness by Rmax Representation

The surface roughness was measured by, in the case of cutting a tool pressing surface, as a surface to be measured, by a plane vertical to the surface to be measured, taking a part by a standard length from an outline (cross-sectional curve) appearing in the cut section, putting the taken part between two straight lines in parallel to an average line of the taken part, measuring a gap between the two straight lines in the longitudinal magnification direction of the crossectional curve and representing the resulting maximum height of the taken part by micron unit. The measurement was carried out by means of a contact type surface roughness meter.

Since the present invention aims at a surface with Rmax of at most 0.8 $\mu$m, the standard length is 0.25 mm.

Flatness in Longitudinal Direction

The flatness was measured by taking a part by a standard length from a curve (undulated curve of filtered wave) obtained by removing components of surface roughness with a shorter wavelength by a low-frequency filter from a cross-sectional curve, putting the taken part by the standard length between two straight lines in parallel to an average line of the taken part, measuring a gap between the straight lines in the longitudinal magnification direction of the undulated curve of filtered wave and representing the resulting value by micron unit. The measurement was carried out by means of a contact type surface roughness meter.

In the present invention, in particular, the surface roughness or flatness is expressed as to the tool pressing surface, so the standard length is in agreement with the longer side of the rectangular shape as the tool pressing surface or with the lengths of four frame-sides making up the rectangular frame-shaped end surface.

Maximum Temperature Gradient in Pressing Surface

The temperatures of respective parts of the pressing surface were measured to obtain a difference between the highest temperature and lowest temperature. The measurement was carried out by means of an infrared radiation thermometer.

Example 1

A cemented carbide containing 88 weight % of WC, 7 weight % TaC and 5 weight % of Co was worked in a shape of 20 mm×20 mm×3 mm. Then, this cemented carbide was subjected to a heat treatment by maintaining it in a CO atmosphere of 200 Torr at a temperature of 1400° C. for 2 hours and cooling to room temperature in vacuum. Microscopic protrusions consisting of carbide solid solution of W and Ta were formed on the surface by this heat treatment and gaps among these protrusions were filled with Co coming out of the inside of the cemented carbide.

When this cemented carbide was immersed in nitric acid kept warm at 50° C. and only Co comming out was dissolved and removed, a cemented carbide whose surface was covered with microscopic protrusions consisting of (W,Ta)C having a mean length of 5 $\mu$m was prepared. It was confirmed that the thus surface-modified cemented carbide had a coefficient of linear expansion of $4.0 \times 10^{-6}$/° C. at a temperature range of room temperature to 400° C., which was similar to that of the cemented carbide before the heat treatment. The thermal conductivity was 80 W/m.K at 400° C.

This cemented carbide, as a substrate, was then arranged in a thermal filament CVD apparatus in such a manner that the surface of 20 mm×20 mm be a surface to be coated as a tool end and subjected to coating of polycrystalline diamond for 20 hours. The synthetic conditions are shown in Table 1.

The recovered cemented carbide had polycrystalline diamond coated on the surface thereof in a thickness of 70 $\mu$m. This polycrystalline diamond was confirmed to have a very high purity represented by a peak ratio (Y/X) of 0.08, wherein X represents diamond carbon and Y represents non-diamond carbon, by Raman spectroscopic analysis. When the preferred orientation of the diamond crystal was examined by X-ray diffraction, furthermore, it was found that it was orientated in the film thickness direction (110).

The polycrystalline diamond-coated surface was converted into a mirror state with a surface roughness of 0.08 $\mu$m by Rmax representation using a diamond wheel and used as a constant heating tool material. The thickness of the polycrystalline diamond after the mirror surface working was 40 $\mu$m.

The resulting tool material and a shank of Kovar was bonded with each other at 600° C. by an Au compression method using an Au foil of 100 $\mu$m in thickness. During the bonding, the bonding surface of the tool material, i.e. the opposite surface to the polycrystalline diamond-coated surface was coated with Ti with a thickness of 1 $\mu$m, Pt with a thickness of 0.2 $\mu$m and Au with a thickness of 3 $\mu$m in this order. The bonding surface of the shank was also coated with Ni with a thickness of 0.3 $\mu$m and Au with a thickness of 3 $\mu$m in this order.

TABLE 1

| | |
|---|---|
| Filament Property | Linear Tungsten Wire of 0.5 mm |
| Filament Temperature | 2100° C. |
| Filament-Substrate Distance | 5 mm |
| Substrate Temperature | 900° C. |
| Raw Material Gas Composition | $CH_4/H_2 = 1.5\%$ |
| Total Flow Rate of Raw Material Gas | 1000 sccm |
| Gas Pressure | 120 Torr |

In order to assess the durability of five constant heating tools (A) prepared by the above described process, IC with three hundred pins was repeatedly bonded at a tool end temperature of 550° C. and a load of 200 kg. For comparison, five tools were respectively prepared in the similar manner using respectively a sintered diamond (B) containing 10 volume % of Co as a binder, a sintered diamond (C) containing 7 volume % of Si and 7 volume % of SiC as a binder and an SiC—$Si_3N_4$ composite sintered body (D) coated with polycrystalline diamond with a thickness of 50 μm by a gaseous phase synthesis method as a tool material and then subjected to the similar assessment. The service life of the tool was measured by the number of bondings until bonding trouble appeared in the bonded pin.

The results are shown in Table 2. As is evident from this table, the sintered diamonds of the prior art are insufficient in wear resistance and heat resistance and in the case of the ceramic substrate coated with polycrystalline diamond, there is still room for improvement in the reliability of strength of the substrate. On the contrary, when using the product of the present invention as a tool material, it is confirmed that stable performances can be exhibited even under such severer operation conditions.

TABLE 2

Results of Assessments:Service Life

| Tool No. | | Operation Number (× 10⁴) | Remarks |
|---|---|---|---|
| Present Invention | A | 80 ~ 100 | no cracks |
| Comparative | B | 5 ~ 8 | tool surface damaged |
| Examples | C | 30 ~ 40 | tool surface damaged |
| | D | 80 ~ 100 | fine cracks found in one substrate |

Example 2

A cemented carbide containing 90 weight % of WC, 5 weight % TaC and 5 weight % of Co was worked in a shape of 30 mm×2 mm×15 mm. Then, this cemented carbide was subjected to a heat treatment by maintaining it in a $N_2$ atmosphere of 100 Torr at a temperature of 1300° C. for 1 hour and cooling to room temperature in vacuum. Microscopic protrusions consisting of carbide solid solution of W and Ti were formed on the surface by this heat treatment and gaps among these protrusions were filled with Co coming out of the inside of the cemented carbide.

When this cemented carbide was immersed in hydrofluoric acid at room temperature and only Co comming out was dissolved and removed, a cemented carbide whose surface was covered with microscopic protrusions consisting of (W,Ti)C having a mean length of 7 μm was prepared. It was confirmed that the thus surface-modified cemented carbide had a coefficient of linear expansion of $4.4 \times 10^{-6}/°$ C. at a temperature range of room temperature to 400° C., which was similar to that of the cemented carbide before the heat treatment. The thermal conductivity was 105 W/m.K at 400° C.

This cemented carbide, as a substrate, was then arranged in a microwave plasma CVD apparatus in such a manner that the surface of 30 mm×2 mm be a surface to be coated as a tool end and subjected to coating of polycrystalline diamond for 30 hours. The synthetic conditions are shown in Table 3.

TABLE 3

| | |
|---|---|
| Microwave Output | 650 W |
| Substrate Temperature | 870° C. |
| Raw Material Gas Composition | $CH_4/H_2 = 1.2\%$ |
| Total Flow Rate of Raw Material Gas | 500 sccm |
| Gas Pressure | 80 Torr |

The recovered cemented carbide had polycrystalline diamond coated on the surface thereof in a thickness of 50 μm. This polycrystalline diamond was confirmed to have a very high purity represented by a peak ratio (Y/X) of 0.05, wherein X represents diamond carbon and Y represents non-diamond carbon, by Raman spectroscopic analysis. When the preferred orientation of the diamond was examined by X-ray diffraction, furthermore, it was found that it was orientated in the film thickness direction (100).

The polycrystalline diamond-coated surface was converted into a mirror state with a surface roughness of 0.08 μm by Rmax representation, using a diamond wheel, and used as a constant heating tool material. The thickness of the polycrystalline diamond after the mirror surface working was 40 μm.

Figure 2:
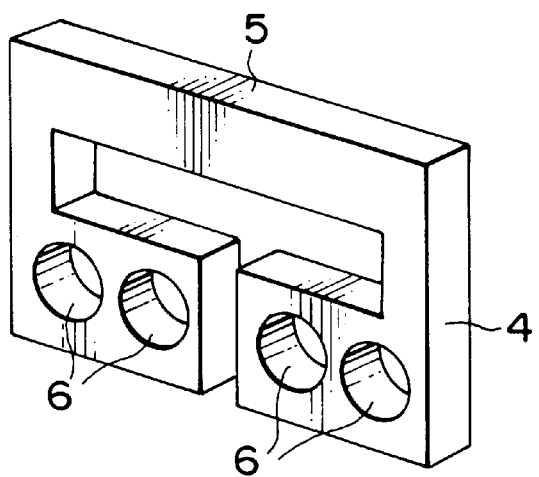
FIG. 2 is a schematic view of another embodiment of the bonding tool of the present invention, i.e. pulse heating tool made of a metal or alloy.

The part of the cemented carbide of the product was then worked in a shape similar to FIG. 2 by a wire electric discharging working machine to obtain a pulse heating tool (E).

The resulting tool was then subjected to assessment of ① thermal response, ② uniformity of temperature distribution and ③ flatness of tool surface as follows:

The thermal response ① was assessed by passing electric current through the tool at room temperature and then measuring a time required for raising the temperature from the start of passing electric current to 400° C. and a time required for cooling from 400° C. to 200° C. from the stop of passing electric current. The uniformity of temperature distribution ② was assessed by measuring, when the central part of the tool end surface was maintained at a temperature of 400° C., the temperature gradient between the central part and left and right ends of the tool end surface. The measurement of temperatures of the tool end surface in the assessments ① and ② was carried out by means of an infrared thermometer.

The flatness of tool surface ③ was assessed by measuring the warped state of the tool surface in the longitudinal direction when the central part of the tool end surface is maintained at room temperature and 400° C.

For comparison, assessment of an Mo tool (F), a tool (G) comprising an Mo shank bonded with the sintered diamond used in the tool (C) of Example 1, worked in a thickness of 1 mm, by brazing and a tool (H) comprising an Mo shank bonded with the polycrystalline diamond-coated ceramics used in the tool (D) of Example 1, worked in a total thickness of 1 mm, by brazing was also carried out.

The results are shown in Table 4. As is evident from these results, the tool of the present invention can favorably be compared with the tools of the prior art in all the respects of thermal response, uniformity of temperature distribution and flatness.

TABLE 4

Results of Assessments

| Tool No. | | Thermal Response at Heating (sec) | Thermal Response at Cooling (sec) | Temperature Distribution (°C.) | Flatness at Room Temperature (μm) | Flatness at 400° C. (μm) |
|---|---|---|---|---|---|---|
| Present Invention | E | 1.1 | 8.9 | 30 | 2 | 5 |
| Comparative Examples | F | 1.1 | 9.0 | 60 | 3 | 15 |
| | G | 2.5 | 18.5 | 85 | 3 | 50 |
| | H | 1.8 | 13.7 | 75 | 3 | 12 |

Example 3

Each of cemented carbides having a composition shown in Table 5 and a thermal conductivity of 60 to 100 W/m.K was worked in a shape of 25 mm×25 mm×4 mm and then subjected to a heat treatment under conditions shown in Table 5. Microscopic protrusions consisting of carbide solid solutions of W and other carbide-forming metals than W were formed on the surface by this heat treatment and gaps among these protrusions were filled with iron group metals coming out of the inside of the cemented carbide. When this cemented carbide was immersed in hydrochloric acid at 80° C. for 5 minutes, only the iron group metals were completely dissolved and removed.

This cemented carbide, as a substrate, was then arranged in a microwave plasma CVD apparatus in such a manner that the surface of 25 mm×25 mm be a surface to be coated as a tool end and subjected to coating of polycrystalline diamond in an analogous manner to Example 2 except adjusting the synthetic time to as shown in Table 5.

The recovered cemented carbide had polycrystalline diamond coated on the surface thereof in a thickness corresponding to the synthetic time and in any case, it was orientated in the film thickness direction (100). This polycrystalline diamond was confirmed to have a very high purity represented by a peak ratio (Y/X) of 0.05, wherein X represents diamond carbon and Y represents non-diamond carbon, by Raman spectroscopic analysis.

The polycrystalline diamond-coated surface was converted into a mirror state with a surface roughness of 0.06 μm by Rmax representation using a diamond wheel and then bonded with a shank made of a W—Ni alloy by the use of a brazing material predominantly consisting of Ag and Cu and having a melting point of 800° C. to prepare a constant heating tool.

In Table 5 are also shown the coefficient of linear expansion of the cemented carbide after the heat treatment and acid treatment, the length of protrusions on the cemented carbide surface formed by the heat treatment and the coating film thickness of polycrystalline diamond.

TABLE 5

Tool Materials

| Tool No. | Cemented Carbide (Composition: wt %) | | | | | Heating Treatment | | | | Cemented Carbide | | | |
|---|---|---|---|---|---|---|---|---|---|---|---|---|---|
| | WC | Other Carbides | | Iron Group Metals | | Heating Retention Conditions | | | | Cooling Cond. | Diamond Synthesis Time | Linear Expansion | Protrusion Mean | Diamond Coating Thickness |
| | Comp. | Variety | Comp. | Variety | Comp. | Pressure (Torr) | Atmosphere | Temp. (° C.) | Time (hr) | Atmosphere | (hr) | (/° C.) | (μm) | (μm) |
| I | 82.6 | Mo$_2$C | 12.6 | Fe—Ni | 4.8 | 120 | CO | 1050 | 1.8 | CO | 32 | 4.7 | 3.7 | 55 |
| J | 83.2 | (Ti,Ta)C | 8.9 | Ni | 7.9 | 450 | N$_2$ | 1180 | 2.3 | vacuum | 28 | 4.7 | 5.5 | 50 |
| K | 90.6 | TiC | 5.6 | Co | 3.8 | 285 | CO | 1370 | 0.6 | N$_2$ | 20 | 4.2 | 7.3 | 25 |
| L | 92.3 | ZrC | 3.5 | Co | 4.2 | 520 | N$_2$ | 1280 | 1.6 | CO | 22 | 4.1 | 7.8 | 30 |
| M | 94.8 | TiC | 2.3 | Co | 2.9 | 600 | CO | 1430 | 2.6 | vacuum | 27 | 4.0 | 6.2 | 45 |
| N | 91.0 | (Ti,Hf)C | 6.8 | Co | 2.2 | 150 | N$_2$ | 1270 | 2.0 | vacuum | 33 | 4.0 | 6.2 | 60 |
| O | 62.5 | TaC | 28.0 | Ni | 9.5 | 300 | CO | 1200 | 2.2 | CO | 27 | 6.3 | 5.1 | 45 |
| P | 70.7 | (Ti,Mo)C | 22.3 | Fe | 7.0 | 65 | CO | 1360 | 0.1 | Ar | 38 | 5.5 | 0.5 | 65 |
| Q | 85.3 | (Ti,Ta)C | 8.2 | Ni | 6.5 | 250 | N$_2$ | 1180 | 8.0 | vacuum | 33 | 4.5 | 20.0 | 60 |
| R | 87.3 | ZrC | 0.3 | Fe—Co | 12.4 | 350 | N$_2$ | 1480 | 2.8 | N$_2$ | 62 | 4.4 | 1.2 | 80 |
| S | 93.1 | (Ti,Hf)C | 3.9 | Co—Ni | 3.0 | 200 | N$_2$ | 720 | 2.3 | N$_2$ | 35 | 4.0 | 0.3 | 62 |
| T | 78.2 | VC | 18.7 | Co—Ni | 3.1 | 720 | N$_2$ | 980 | 1.3 | vacuum | 2 | 5.1 | 2.3 | 4 |
| U | 91.8 | (Ta,Cr)C | 6.2 | Fe—Ni | 2.0 | 30 | CO | 1260 | 1.4 | Ar | 80 | 4.1 | 4.6 | 120 |

In order to assess the durability of these tools (I~U), IC with 270 pins was repeatedly bonded at a tool end temperature of 580° C. and a load of 230 kg. For comparison, tools were respectively prepared in the similar manner using respectively a sintered diamond (V) containing 8 volume % of Co as a binder, a sintered diamond (W) containing 7 volume % of Si and 9 volume % of SiC as a binder and an SiC sintered body (X) coated with polycrystalline diamond with a thickness of 30 μm by a gaseous phase synthesis method as a tool material and then subjected to the similar assessment. The service life of the tool was measured by the number of bondings until bonding trouble appeared in the bonded pin.

In Table 6 are shown assessment results of the durability of these tools. As is evident from this table, Tool Nos. I to N according to the present invention give longer service lives than the tools of the prior art.

In the case of Tool No. O, the polycrystalline diamond film after brazed was cracked during mirror surface working and thus it was not subjected to assessment. This is probably due to that the cemented carbide has the composition outside the scope of the present invention and a larger coefficent of linear expansion, resulting in a larger thermal stress during brazing.

In the case of Tool Nos. P to S, the polycrystalline diamond film was stripped or cracked to result in shorter service lives. This is considered due to that the heat treatment time is too shorter in the case of Tool No. P, the content of ZrC is too small in the case of Tool No. R, and the heat treatment temperature is too lower to result in sufficient lengths of protrusions on the surface of the cemented carbide and consequently, the bonding strength of the polycrystalline diamond film is not increased in the case of Tool No. S. In the case of Tool No. Q, cracks are formed in the polycrystalline diamond film, which is probably due to that the heat treatment time is so long that the lengths of protrusions formed on the cenebted carbide surface are longer and gaps among the protrusions cannot completely be covered by the polycrystalline diamond.

In the case of Tool Nos. T and U, moreover, cracks occur in the polycrystalline diamond film to shorten the service lives thereof, which is probably due to that the synthetic time of the polycrystalline diamond is not suitable and the film thickness is not optimized.

TABLE 6

| Tool No. | Service Life (× 10$^4$) | Remarks |
| --- | --- | --- |
| I | 90 | — |
| J | 90 | — |
| K | 100 | — |
| L | 100 | — |
| M | 95 | — |
| N | 95 | — |
| O | — | no assessment because of cracking during mirror face working |
| P | 10 | stripping of polycrystalline diamond film |
| Q | 5 | cracking of polycrystalline diamond film |
| R | 12 | stripping of polycrystalline diamond film |
| S | 8 | stripping of polycrystalline diamond film |
| T | 15 | cracking of polycrystalline diamond film |
| U | 16 | cracking of polycrystalline diamond film |
| V | 5 | damage of tool surface |
| W | 20 | damage of tool surface |
| X | 85 | cracking of substrate |

Example 4

A cemented carbide containing 92 weight % of WC, 4 weight % TaC and 4 weight % of Co was worked in a shape of 25 mm×2 mm×2 mm. Then, this cemented carbide was subjected to a heat treatment by maintaining it in an $N_2$ atmosphere of 200 Torr at a temperature of 1400° C. for 2 hours and cooling to room temperature in vacuum. Microscopic protrusions consisting of carbide solid solution of W and Ta were formed on the surface by this heat treatment and gaps among these protrusions were filled with Co coming out of the inside of the cemented carbide.

When this cemented carbide was immersed in aqua regia at room temperature and only Co comming out was dissolved and removed, a cemented carbide whose surface was covered with microscopic protrusions consisting of (W,Ta)C having a mean length of 6 μm was prepared. It was confirmed that the thus surface-modified cemented carbide had a coefficient of linear expansion of $4.3 \times 10^{-6}$/° C. at a temperature range of room temperature to 400° C., which was similar to that of the cemented carbide before the heat treatment. The thermal conductivity was 110 W/m.K at 400° C.

This cemented carbide, as a substrate, was then arranged in a thermal filament CVD apparatus in such a manner that the surface of 25 mm×2 mm be a surface to be coated as a tool end and subjected to coating of polycrystalline diamond under the same conditions as those of Example 1.

The recovered cemented carbide had polycrystalline diamond coated on the surface thereof in a thickness of 70 μm. This polycrystalline diamond was confirmed to have a very high purity represented by a peak ratio (Y/X) of 0.08, wherein X represents diamond carbon and Y represents non-diamond carbon, by Raman spectroscopic analysis.

Figure 3:
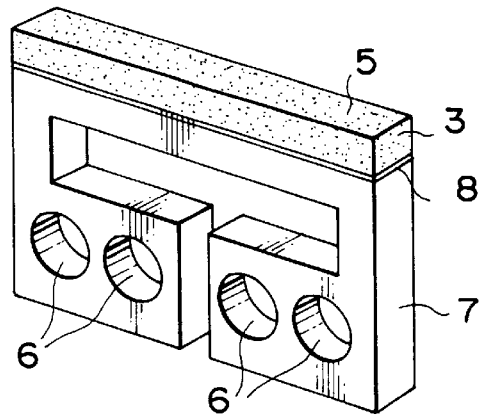
FIG. 3 is a schematic view of a pulse heating tool having such a structure that a tool material is bonded to the end of a shank made of a metal or alloy.

The polycrystalline diamond-coated cemented carbide was bonded to a shank made of Mo by brazing to obtain a bonding tool as shown in FIG. 3, using a brazing material consisting predominantly of Ag and Cu and having a melting point of 850° C.

The polycrystalline diamond-coated surface was then converted into a mirror state with a surface roughness of 0.06 μm by Rmax representation using a diamond wheel. The thickness of the polycrystalline diamond after the mirror surface working was 30 μm.

The pulse heating tool prepared by the above described process was subjected to assessment of the properties in the similar manner to Example 2.

Consequently, it was found that the thermal response was 1.1 seconds at heating and 9.0 seconds at cooling, which was comparable to the properties of the Mo tool (Tool No. F of Table 4), and the flatness was represented by 3 μm at room temperature and 4 μm at 400° C., which was considerably good.

Example 5

A cemented carbide containing 88 weight % of WC, 7.5 weight % TaC and 4.5 weight % of Co was worked in a shape of 250 mm×2 mm×2 mm. Then, this cemented carbide was subjected to a heat treatment by maintaining it in a CO atmosphere of 180 Torr at a temperature of 1380° C. for 1 hour and cooling to room temperature in vacuum. Microscopic protrusions consisting of carbide solid solution of W and Ta were formed on the surface by this heat treatment and gaps among these protrusions were filled with Co coming out of the inside of the cemented carbide.

When this cemented carbide was immersed in nitric acid kept warm at 40° C. and only Co comming out was dissolved and removed, a cemented carbide whose surface was covered with microscopic protrusions consisting of (W,Ta)C having a mean length of 4 μm was prepared. It was confirmed that the thus surface-modified cemented carbide had a coefficient of linear expansion of $4.5 \times 10^{-6}$/° C. at a temperature range of room temperature to 400° C., which was similar to that of the cemented carbide before the heat treatment.

This cemented carbide, as a substrate, was then arranged in a thermal filament CVD apparatus in such a manner that the surface of 250 mm×2 mm be a surface to be coated as a tool end and subjected to coating of polycrystalline diamond for 30 hours. The synthetic conditions are shown in Table 7.

TABLE 7

| | |
| --- | --- |
| Filament Property | Linear Tungsten Wire of 0.4 mm |
| Filament Temperature | 2050° C. |
| Filament-Substrate Distance | 4 mm |
| Substrate Temperature | 950° C. |
| Raw Material Gas Composition | $CH_4/H_2$ = 1.2% |
| Total Flow Rate of Raw Material Gas | 1100 sccm |
| Gas Pressure | 100 Torr |

The recovered cemented carbide had polycrystalline diamond coated on the surface thereof in a thickness of 80 μm.

This polycrystalline diamond was confirmed to have a very high purity represented by a peak ratio (Y/X) of 0.06, wherein X represents diamond carbon and Y represents non-diamond carbon, by Raman spectroscopic analysis. When the preferred orientation of the diamond crystal was examined by X-ray diffraction, furthermore, it was found that it was orientated in the film thickness direction (110).

Figure 6:
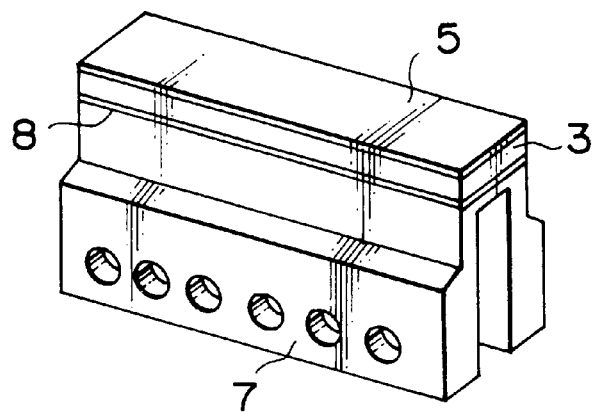
FIG. 6 is a schematic view of a further embodiment of the bonding tool of the present invention, having such a design that the tool end part is bonded to a shank to yield a precision property.

The resulting tool material and a shank of Super Invar were bonded with each other by the use of a silver braze having a melting point of 800° C. and the polycrystalline diamond-coated surface was polished by a diamond wheel while heating in such a manner that the temperature of the central part of the tool pressing part be 250° C. Thus, the polycrystalline diamond-coated surface was converted into a mirror state with a surface roughness of 0.08 $\mu$m by Rmax representation to obtain a pulse heating tool with a shape shown in FIG. 7. The thickness of the polycrystalline diamond after the mirror surface working was 40 $\mu$m. In FIG. 6, 3 designates a cemented carbide substrate, 5 designates polycrystalline diamond, 7 designates a shank and 8 designates a brazing material. In order to assess the properties of Tool No. 1 prepared by the above described process, measurement of the flatness of the pressing surface in the longitudinal direction and the temperature distribution in the pressing surface was carried out. For comparison, preparation and assessment of Tool No. 2 of Super Invar were also carried out.

The measurement of the flatness was carried out according to the method described in Japanese Patent Laid-Open Publication No. 326642/1993. That is, a measurement jig was first prepared comprising a cemented carbide substrate having a flat surface, on which twenty Au wires each having a diameter of 0.1 mm were arranged in parallel. Then, each tool such that the temperature of the central part of the pressing surface was adjusted to 250° C. was arranged in such a manner that the longitudinal direction of the twenty Au wires and the longitudinal direction of the tool were vertically crossed and the tool was pressed to the Au wires to deform the Au wires. The quantity of the deformation was measured.

The temperature distribution in the pressing surface was measured by an infrared radiation thermometer.

The results are shown in Table 8. As is evident from this table, the tool made of Super Invar of the prior art is insufficient in any properties. On the contrary, when using the product of the present invention as a tool material, it is confirmed that the requirement for such a high precision can sufficiently be satisfied.

TABLE 8

| Assessment Tool | Results | |
|---|---|---|
| | Flatness ($\mu$m) | Largest Temp. Gradient (°C.) |
| Tool No. 1 (Present Invention) | 2.5 | 5 |
| Tool No. 2 (Prior Art) | 8.2 | 28 |

Furthermore, using these tools, leads of ten electronic parts were in a lump bonded with wirings of a printed circuit by constant heating system. In this case, the bonding was carried out by feeding always to the tool and heat-generating so that the central part of the tool pressing surface exhibited a constant temperature, i.e. 250° C., and pressing, using an anisotropic conductive film consisting of a thermosetting resin containing Au grains.

As a result, Tool No. 1 of the present invention was capable of bonding uniformly and well any parts, whilst Tool No. 2 for comparison resulted in poor bonding in articles bonded by both the end parts of the pressing surface, which could not be put to practical use.

Example 6

A cemented carbide containing 90 weight % of WC, 6 weight % TiC and 4 weight % of Co was worked in a shape of 300 mm×150 mm×3 mm. Then, this cemented carbide was subjected to a heat treatment by maintaining it in an $N_2$ atmosphere of 120 Torr at a temperature of 1360° C. for 1.5 hour and cooling to room temperature in vacuum. Microscopic protrusions consisting of carbide solid solution of W and Ti were formed on the surface by this heat treatment and gaps among these protrusions were filled with Co coming out of the inside of the cemented carbide.

When this cemented carbide was immersed in hydrochloric acid at room temperature and only Co comming out was dissolved and removed, a cemented carbide whose surface was covered with microscopic protrusions consisting of (W,Ti)C having a mean length of 5 $\mu$m was prepared. It was confirmed that the thus surface-modified cemented carbide had a coefficient of linear expansion of $4.6 \times 10^{-6}$/° C. at a temperature range of room temperature to 400° C., which was similar to that of the cemented carbide before the heat treatment.

This cemented carbide, as a substrate, was then arranged in a microwave plasma CVD apparatus in such a manner that the surface of 300 mm×3 mm be a surface to be coated as a tool end and subjected to coating of polycrystalline diamond for 25 hours. The synthetic conditions are shown in Table 9.

TABLE 9

| Microwave Output | 660 W |
|---|---|
| Substrate Temperature | 880° C. |
| Raw Material Gas Composition | $CH_4/H_2$ = 1.0% |
| Total Flow Rate of Raw Material Gas | 450 sccm |
| Gas Pressure | 130 Torr |

The recovered cemented carbide had polycrystalline diamond coated on the surface thereof in a thickness of 60 $\mu$m. This polycrystalline diamond was confirmed to have a very high purity represented by a peak ratio (Y/X) of 0.06, wherein X represents diamond carbon and Y represents non-diamond carbon, by Raman spectroscopic analysis. When the preferred orientation of the diamond was examined by X-ray diffraction, furthermore, it was found orientated in the film thickness direction (100).

The polycrystalline diamond-coated surface to be a tool pressing surface was polished by a diamond wheel while heating so that the central part of the polycrystalline diamond-coated surface had a temperature of 250° C., thus resulting in a mirror state with a surface roughness of 0.08 $\mu$m by Rmax representation. The thickness of the polycrystalline diamond after the mirror surface working was 25 $\mu$m.

Figure 4:
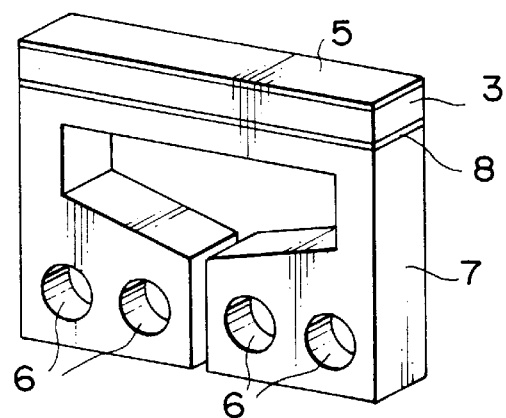
FIG. 4 is a schematic view of a pulse heating tool having such a typical structure that the tool end surface consists of polycrystalline diamond.

The part of the cemented carbide of the product was then worked in a shape similar to FIG. 4 by a wire electric discharging working machine to obtain a pulse heating tool (Tool No. 3).

The resulting tool was then subjected to assessment of ① thermal response, ② temperature distribution of tool pressing surface and ③ flatness of tool pressing surface as follows:

The thermal response ① was assessed by passing electric current through the tool at room temperature and then measuring a time required for raising the temperature from the start of passing electric current to 380° C. and a time required for cooling from 380° C. to 200° C. from the stop of passing electric current. The temperature distribution ② was assessed by measuring, when the central part of the tool end surface was maintained at a temperature of 380° C., the temperatures of some parts of the tool pressing surface in the similar manner to Example 5 to assess the largest temperature gradient.

The flatness of tool surface ③ was assessed by measuring the warped state of the tool surface in the longitudinal direction in the similar manner to Example 5, when the central part of the tool end surface is maintained at room temperature and 400° C.

For comparison, assessment of an Mo tool (Tool No. 4) and a Super Invar tool (Tool No. 5) was carried out.

The results are shown in Table 10. As is evident from these results, the tool of the present invention can favorably be compared with the tools of the prior art in all the respects of thermal response, uniformity of temperature distribution and flatness.

TABLE 10

| | Results of Assessments | | | |
|---|---|---|---|---|
| Tool No. | Thermal Response at Heating (sec) | Thermal Response at Cooling (sec) | Largest Temperature Gradient (°C.) | Flatness at 400° C. (μm) |
| Present Invention | | | | |
| 3 | 1.0 | 8.9 | 6 | 2.1 |
| Comparative Examples | | | | |
| 4 | 1.1 | 9.0 | 20 | 18.6 |
| 5 | 1.8 | 18.5 | 30 | 12.5 |

Example 7

Each of cemented carbides having a composition shown in Table 11 was worked in a shape of 350 mm×3 mm×2 mm and then subjected to a heat treatment under conditions shown in Table 11. Microscopic protrusions consisting of carbide solid solutions of W and other carbide-forming metals than W were formed on the surface by this heat treatment and gaps among these protrusions were filled with iron group metals coming out of the inside of the cemented carbide.

When this cemented carbide was immersed in hydrochloric acid at 70° C. for 3 minutes, only the iron group metals were completely dissolved and removed.

This cemented carbide, as a substrate, was then arranged in a thermal filament CVD apparatus in such a manner that the surface of 350 mm×2 mm be a surface to be coated as a tool end and subjected to coating of polycrystalline diamond in an analogous manner to Example 5 except adjusting the synthetic time to as shown in Table 11.

The recovered cemented carbide had polycrystalline diamond coated on the surface thereof in a thickness corresponding to the synthetic time and in any case, it was orientated in the film thickness direction (100). This polycrystalline diamond was confirmed to have a very high purity represented by a peak ratio (Y/X) of 0.04, wherein X represents diamond carbon and Y represents non-diamond carbon, by Raman spectroscopic analysis.

Each of the tool materials was bonded with a shank made of a W—Ni alloy by brazing an opposite surface to the polycrystalline diamond-coated surface using a brazing agent predominantly of Ag and Cu and having a melting point of 800° C. Then, the bonded body was polished by a diamond wheel while heating so that the temperature of the surface to be worked, as a pressing surface, be 300° C. to yield a mirror state with a surface roughness of 0.06 μm by Rmax representation. For comparison, only Tool No. 14 was subjected to ordinary polishing working without effecting the above described heating and polishing.

In Table 11 are also shown the coefficient of linear expansion of the cemented carbide after the heat treatment and acid treatment, the length of protrudions on the cemented carbide surface formed by the heat treatment and the coating film thickness of polycrystalline diamond.

TABLE 11

| | Tool Materials | | | | | | | | | | | |
|---|---|---|---|---|---|---|---|---|---|---|---|---|
| | Cemented Carbide (Composition: wt %) | | | | | Heating Treatment | | | | Cemented Carbide | | |
| | | | | | | Heating | | | Cooling | Diamond | | Protru- | Diamond |
| | | | | | Iron | Retention Conditions | | | Cond. | Synthe- | Linear | sion | Coating |
| Tool No. | WC Comp. | Other Carbides Variety | Comp. | Group Metals Variety | Comp. | Pressure (Torr) | Atmosphere | Temp. (°C.) | Time (hr) | Atmosphere | sis Time (hr) | Expansion (/°C.) | Mean (μm) | Thickness (μm) |
| 6 | 82.6 | Mo₂C | 12.6 | Fe—Ni | 4.8 | 120 | CO | 1050 | 1.8 | CO | 32 | 4.7 | 3.7 | 55 |
| 6 | 82.6 | Mo₂C | 12.6 | Fe—Ni | 4.8 | 120 | CO | 1050 | 1.8 | CO | 32 | 4.7 | 3.7 | 55 |
| 7 | 83.2 | (Ti,Ta)C | 8.9 | Ni | 7.9 | 450 | N₂ | 1180 | 2.3 | vacuum | 28 | 4.7 | 5.5 | 50 |
| 8 | 90.6 | TiC | 5.6 | Co | 3.8 | 285 | CO | 1370 | 0.6 | N₂ | 20 | 4.2 | 7.3 | 25 |
| 9 | 92.3 | ZrC | 3.5 | Co | 4.2 | 520 | N₂ | 1280 | 1.6 | CO | 22 | 4.1 | 7.8 | 30 |
| 10 | 94.8 | TiC | 2.3 | Co | 2.9 | 600 | CO | 1430 | 2.6 | vacuuin | 27 | 4.0 | 6.2 | 45 |
| 11 | 91.0 | (Ti,Hf)C | 6.8 | Co | 2.2 | 150 | N₂ | 1270 | 2.0 | vacuum | 33 | 4.0 | 6.2 | 60 |
| 12 | 62.5 | TaC | 28.0 | Ni | 9.5 | 300 | CO | 1200 | 2.2 | CO | 27 | 6.3 | 5.1 | 45 |
| 13 | 82.6 | TiC | 12.6 | Fe—Ni | 4.8 | 120 | CO | 1050 | 1.8 | CO | 32 | 4.7 | 3.7 | 55 |
| 14 | 90.6 | (Ti,Hf)C | 5.6 | Co | 3.8 | 260 | N₂ | 1370 | 0.6 | N₂ | 5 | 4.2 | 7.3 | 6 |

Of these tools, Tool No. 12 was cracked in the polycrystalline diamond during working. This is probably due to that the coefficient of the linear expansion of the cemented carbide is large and accordingly, the thermal stress during brazing is increased.

In order to assess the durability of Tool Nos. 6 to 14 except Tool No. 12, the flatness and temperature distribution of the tool, when the temperature of the central part of the tool pressing surface was 300° C., were measured. For comparison, preparation and assessment of a tool of Super Invar was carried out. The assessment results of these tools are shown in Table 12.

TABLE 12

| Tool No. | Flatness ($\mu$m) | Largest Temp. Gradient (°C.) |
|---|---|---|
| 6 | 1.5 | 8 |
| 7 | 2.1 | 6 |
| 8 | 2.3 | 5 |
| 9 | 1.6 | 9 |
| 10 | 1.8 | 2 |
| 11 | 0.8 | 4 |
| 13 | 3.8 | 6 |
| 14 | 1.5 | 12 |
| 15 | 15.3 | 32 |

In the case of Tool Nos. 6 to 11, a good flatness and largest temperature gradient are obtained. In Tool No. 13, the flatness is increased, which is probably due to that polishing of the tool pressing surface is carried out without controlling the temperature of the surface to be worked. In Tool No. 14, the largest temperature gradient is large. This result would be caused by the fact that the thickness of the polycrystalline diamond is too small to obtain the coating effect thereof.

Using these tools, fourteen LCD display drivers were in a lump bonded to a glass substrate by a pulse heating system. Herein, the bonding was carried out by feeding so that the central part of the tool pressing surface be a constant temperature, i.e. 300° C., heat generating and pressing, the pressing being then released after cooling to 150° C. The bonding was carried out using an anisotropic conductive film consisting of a thermosetting resin containing Ni grains.

As a result, Tool Nos. 6 to 11 of the present invention were capable of bonding uniformly and well the LCD display drivers, whilst Tool Nos. 13 to 15 for comparison resulted in poor bonding in articles bonded by both the end parts of the pressing surface, which could not be put to practical use.

Example 8

Figure 9:
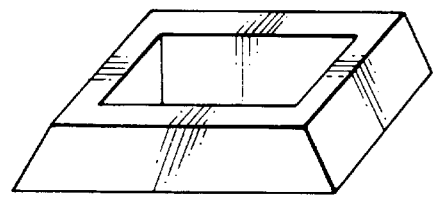
FIG. 9 is a schematic view of a cemented carbide substrate with a hollow square frustum, used in Example 8.

A cemented carbide containing 87 weight % of WC, 8.5 weight % TaC and 4.5 weight % of Co was worked in a shape of a hollow square frustum shown in FIG. 9. The dimensions of each part were 25 mm in each side length at the bottom, 16 mm in each side length at the uppermost, 3 mm high and 0.3 mm wide in frame-shaped upper surface. Then, this cemented carbide was subjected to a heat treatment by maintaining it in a CO atmosphere of 190 Torr at a temperature of 1390° C. for 1.5 hours and cooling to room temperature in vacuum. Microscopic protrusions consisting of carbide solid solution of W and Ta were formed on the surface by this heat treatment and gaps among these protrusions were filled with Co coming out of the inside of the cemented carbide.

When this cemented carbide was immersed in nitric acid kept warm at 60° C. and only Co comming out was dissolved and removed, a cemented carbide whose surface was covered with microscopic protrusions consisting of (W,Ta)C having a mean length of 3 $\mu$m was prepared. It was confirmed that the thus surface-modified cemented carbide had a coefficient of linear expansion of $4.4 \times 10^{-6}$/° C. at a temperature range of room temperature to 400° C., which was similar to that of the cemented carbide before the heat treatment.

This cemented carbide, as a substrate, was then arranged in a thermal filament CVD apparatus in such a manner that the surface to be a tool end be a surface to be coated and subjected to coating of polycrystalline diamond for 40 hours. The synthetic conditions are shown in Table 13.

TABLE 13

| Filament Property | Linear Ta Wire of 0.5 mm |
|---|---|
| Filament Temperature | 2100° C. |
| Filament-Substrate Distance | 5 mm |
| Substrate Temperature | 970° C. |
| Raw Material Gas Composition | $CH_4/H_2 = 1.1\%$ |
| Total Flow Rate of Raw Material Gas | 1200 sccm |
| Gas Pressure | 120 Torr |

The recovered cemented carbide had polycrystalline diamond coated on the surface thereof in a thickness of 90 $\mu$m. This polycrystalline diamond was confirmed to have a very high purity represented by a peak ratio (Y/X) of 0.05, wherein X represents diamond carbon and Y represents non-diamond carbon, by Raman spectroscopic analysis. When the preferred orientation of the diamond crystal was examined by X-ray diffraction, furthermore, it was found that it was orientated in the film thickness direction (110).

The resulting tool material and a shank of a W—Ni alloy were bonded with each other by the use of a silver braze having a melting point of 830° C. and the polycrystalline diamond-coated surface was polished by a diamond wheel while controlling heating in such a manner that the maximum temperature of the tool end surface be 500° C. to obtain Tool No. 16 with a shape shown in FIG. 8. The thickness of the polycrystalline diamond after the mirror surface working was 30 $\mu$m.

For comparison, Tool Nos. 17 and 18 were prepared in the similar manner to Tool No. 16 respectively using, for the tool end part, a sntered diamond containing 10 volume % of Co as a binder and sintered diamond containing 7 volume % of Si and 7 volume % of SiC as a binder. Since in the case of Tool No. 17, the sintered diamond used did not have heat resistance, brazing was carried out using a silver braze with a melting point of 650° C.

Assessment of the properties of these tools, as a constant heating tool, was carried out by the following method. That is, the surface roughness, flatness and temperature distribution of the tool end surface were measured under such a condition that the highest temperature of the end surface of each tool was adjusted to 500° C. While the highest temperature of the end surface was maintained at 500° C. and a load of 200 kg was applied to each tool, an operation of lead frame bonding of ASIC with 300 pins was repeated. After operating $10 \times 10^4$ times, the above described properties of each tool were again measured to assess change of the properties from the initial state.

Herein, the measurement of the flatness was carried out in an analogous manner to Example 5.

The results are shown in Table 14. As is evident from this table, the two kinds of the sintered diamond tools, i.e. Tool Nos. 17 and 18 assessed as comparative examples, are insufficient and largely deteriorated with operations in any properties. In the case of Tool No. 17, position shift of the sintered diamond at the end was observed after operating $10 \times 10^4$ times. This is probably due to that flowing deformation took place because of the low melting point of the brazing material used. On the contrary, when using the product of the present invention as a tool material, it was confirmed that the excellent properties were not deteriorated even after the operation for a long time.

TABLE 14

| Assessment | Results | | | | | |
|---|---|---|---|---|---|---|
| | Surface Roughness ($\mu$m) | | Flatness ($\mu$m) | | Largest Temp. Gradient (°C.) | |
| Tool | Initial | $10^5$ Uses | Initial | $10^5$ Uses | Initial | $10^5$ Uses |
| Present Invention | | | | | | |
| Tool No. 16 | 0.07 | 0.08 | 1.0 | 1.1 | 10 | 10 |
| Comparative Example | | | | | | |
| Tool No. 17 | 0.07 | 0.25 | 2.2 | 12.3 | 32 | 48 |
| Tool No. 18 | 0.07 | 0.17 | 1.8 | 7.2 | 26 | 34 |

Example 9

Figure 10:
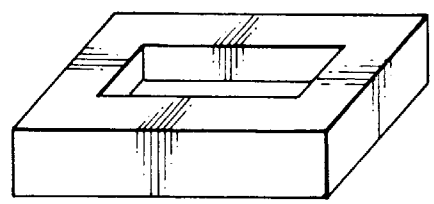
FIG. 10 is a schematic view of a cemented carbide substrate with a hollow rectangular parallelepiped (rectangular frame), used in Example 9.
Figure 11:
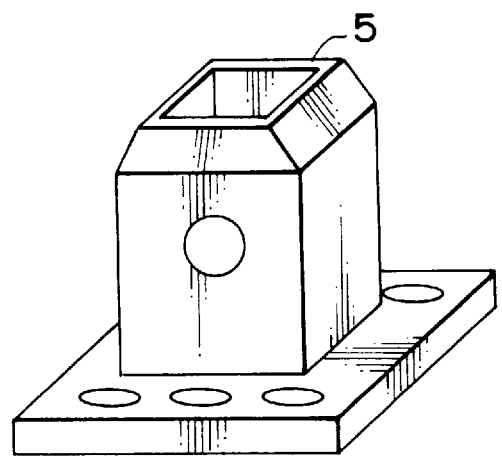
FIG. 11 is a schematic view of a still further embodiment of the bonding tool of the present invention, of such a type that the tool end part has a shape of hollow square frustum, used for mounting ASIC.

A cemented carbide containing 90 weight % of WC, 6 weight % TiC and 4 weight % of Co was worked in a hollow rectangular parallelepiped having a rectangular frame-shaped end surface as shown in FIG. 10. The dimensions of each part were 25 mm and 20 mm respectively in outer long side length and short side length and 20 mm and 15 mm in inner long side length and short side length, and 5 mm high. Then, this cemented carbide was subjected to a heat treatment by maintaining it in an Nz atmosphere of 110 Torr at a temperature of 1400° C. for 1.2 hour and cooling to room temperature in vacuum. Microscopic protrusions consisting of carbide solid solution of W and Ti were formed on the surface by this heat treatment and gaps among these protrusions were filled with Co coming out of the inside of the cemented carbide.

When this cemented carbide was immersed in hydrochloric acid at room temperature and only Co comming out was dissolved and removed, a cemented carbide whose surface was covered with microscopic protrusions consisting of (W,Ti)C having a mean length of 4 $\mu$m was prepared. It was confirmed that the thus surface-modified cemented carbide had a coefficient of linear expansion of $4.6 \times 10^{-6}$/° C. at a temperature range of room temperature to 400° C., which was similar to that of the cemented carbide before the heat treatment.

This cemented carbide, as a substrate, was then arranged in a microwave plasma CVD apparatus in such a manner that one end surface of the rectangular frame-shaped body be a surface to be coated as a tool end and subjected to coating of polycrystalline diamond for 38 hours. The synthetic conditions are shown in Table 15.

TABLE 15

| Microwave Output | 700 W |
|---|---|
| Substrate Temperature | 920° C. |
| Raw Material Gas Composition | $CH_4/H_2$ = 0.9% |
| Total Flow Rate of Raw Material Gas | 800 sccm |
| Gas Pressure | 60 Torr |

The recovered cemented carbide had polycrystalline diamond coated on the surface thereof in a thickness of 70 $\mu$m. This polycrystalline diamond was confirmed to have a very high purity represented by a peak ratio (Y/X) of 0.05, wherein X represents diamond carbon and Y represents non-diamond carbon, by Raman spectroscopic analysis. When the preferred orientation of the diamond was examined by X-ray diffraction, furthermore, it was found orientated in the film thickness direction (110).

This tool material and a shank made of Mo were bonded with a Cu braze having a melting point of 850° C. and then polished by a diamond wheel while controlling heating so that the highest temperature of the tool end surface be 340° C., thus resulting in a mirror state with a surface roughness of 0.06 $\mu$m by Rmax representation.

The bonded body was subjected to a chamfering working to prepare a hollow frustum-shaped Tool No. 19 having a rectangular end surface as shown in FIG. 8. After the working, the thickness of the polycrystalline diamond was 20 $\mu$m.

Furthermore, three kinds of tools (Tool Nos. 20, 21 and 22) having different thicknesses of polycrystalline diamond coatings after completion of the tools were prepared. The thickness of polycrystalline diamond after the working was respectively 16 $\mu$m (Tool No. 20), 13 $\mu$m (Tool No. 21) and 5 $\mu$m (Tool No. 22). In addition, three kinds of tools (Tool Nos. 23, 24 and 25) differing in flatness of tool end surface were prepared for trial.

For comparison, assessment of Tool No. 26 comprising a sintered diamond containing 5 volume % of SiC and 5 volume % of Si, prepared in the similar manner to Tool No. 19, and Tool No. 27 consisting of Mo simple substance was carried out.

Assessment of the properties of these tools, as a pulse heating tool, was carried out by the following method. That is, the surface roughness, flatness and temperature distribution of the tool end surface at 340° C. were measured by previously determining the feeding condition so that the highest temperature of the end surface of each tool was adjusted to 340° C. The thermal response of each of the tools was measured under the above described feeding condition. The assessment was carried out by measuring the heating time until the highest temperature of the tool end surface was increased from room temperature to 340° C. and the cooling time from the stop of feeding when the highest temperature of the tool end surface was 340° C. to 150° C. by starting forced air cooling, followed by comparing them.

Using each of these tools whose end surface was maintained at the highest temperature of 340° C., mounting by soldering a flatpack IC to a printd circuit was repeatedly carried out $10 \times 10^4$ times. The assessment results are shown in Table 16. As is evident from these results, the tool of the present invention can favorably be compared with the tool of the prior art in all the respects of thermal response, uniformity of temperature distribution and flatness. Even in the repetition of real mountings, moreover, the tool service life was largely improved without any problem.

TABLE 16

Assessment Results

| Tool No. | Thermal Response at Heating (sec) | Thermal Response at Cooling (sec) | Largest Temperature Gradient (°C.) | Flatness (μm) | Assessment of Mounting 10 × 10⁴ Times |
|---|---|---|---|---|---|
| Present Invention | | | | | |
| 19 | 1.0 | 2.9 | 6 | 1.1 | normal, continuously available |
| 20 | 1.1 | 3.1 | 18 | 1.1 | normal, continuously available |
| Comparative Examples | | | | | |
| 21 | 1.0 | 3.0 | 22 | 1.5 | poor bonding after using 6 × 10⁴ times |
| 22 | 1.0 | 2.9 | 25 | 1.8 | poor bonding after using 3 × 10⁴ times |
| Present Invention | | | | | |
| 23 | 1.1 | 2.9 | 6 | 2.8 | normal, continuously available |
| Comparative Examples | | | | | |
| 24 | 1.0 | 3.0 | 5 | 3.2 | poor bonding after using 6 × 10⁴ times |
| 25 | 1.1 | 2.9 | 7 | 5.1 | poor bonding after using 4 × 10⁴ times |
| 26 | 1.8 | 5.0 | 23 | 3.2 | poor bonding after using 5 × 10⁴ times |
| 27 | 1.1 | 3.1 | 30 | 12.7 | poor bonding after using 4 × 10⁴ times |

Example 10

A cemented carbide containing 87 weight % of WC, 7.2 weight % TiC and 5.8 weight % of Co was worked in a shape of 20 mm×3 mm×2 mm. A penetration hole of 1 mm in diameter was vertically made by discharge working at the central part of the 20 mm×3 mm surface. Then, this cemented carbide was subjected to a heat treatment by maintaining it in a CO atmosphere of 160 Torr at a temperature of 1390° C. for 1 hour and cooling to room temperature in vacuum. Microscopic protrusions consisting of carbide solid solution of W and Ti were formed on the surface by this heat treatment and gaps among these protrusions were filled with Co coming out of the inside of the cemented carbide.

When this cemented carbide was immersed in nitric acid kept warm at 60° C. and only Co comming out was dissolved and removed, a cemented carbide whose surface was covered with microscopic protrusions consisting of (W,Ti)C having a mean length of 3 μm was prepared. It was confirmed that the thus surface-modified cemented carbide had a coefficient of linear expansion of $4.4 \times 10^{-6}/°$ C. at a temperature range of room temperature to 400° C., which was similar to that of the cemented carbide before the heat treatment.

This cemented carbide, as a substrate, was then arranged in a thermal filament CVD apparatus in such a manner that the surface of 20 mm×3 mm be a surface to be coated as a tool end and subjected to coating of polycrystalline diamond for 50 hours. The synthetic conditions are shown in Table 17.

TABLE 17

| | |
|---|---|
| Filament Property | Linear Ta Wire of 0.5 mm |
| Filament Temperature | 2100° C. |
| Filament-Substrate Distance | 5 mm |
| Substrate Temperature | 900° C. |
| Raw Material Gas Composition | $CH_4/H_2 = 0.8\%$ |
| Total Flow Rate of Raw Material Gas | 1000 sccm |
| Gas Pressure | 120 Torr |

The recovered cemented carbide had polycrystalline diamond coated on the surface thereof in a thickness of 70 μm. This polycrystalline diamond was confirmed to have a very high purity represented by a peak ratio (Y/X) of 0.07, wherein X represents diamond carbon and Y represents non-diamond carbon, by Raman spectroscopic analysis. When the preferred orientation of the diamond crystal was examined by X-ray diffraction, furthermore, it was found that it was orientated in the film thickness direction (100).

The resulting tool material and a shank consisting of Fe-29 weight % Ni-17 weight % Co were bonded with each other by the use of a silver braze having a melting point of 820° C. and the polycrystalline diamond-coated surface was polished by a diamond wheel while heating in such a manner that the temperature of the central part of the tool pressing part be 250° C. Thus, the polycrystalline diamond-coated surface was converted into a mirror state with a surface roughness of 0.07 μm by Rmax representation to obtain a bonding tool with a shape shown in FIG. 12. In FIG. 12, 3 designates a cemented carbide substrate, 5 designates polycrystalline diamond, 7 designates a shank, 8 designates a brazing material and H designates a vacuum adsorption hole. The thickness of the polycrystalline diamond 5 was 40 μm.

In order to assess the properties of Tool No. 28, prepared by the above described process, measurement of the flatness of the pressing surface in the longitudinal direction and the temperature distribution in the pressing surface was carried out. For comparison, preparation and assessment of Tool No. 29 of Super Invar simple substance with the same shape were also carried out.

Herein, the measurement of the flatness was carried out in an analogous manner to Example 5.

The temperature distribution in the pressing surface was measured by an infrared radiation thermometer.

The results are shown in Table 18. As is evident from this table, the tool made of Super Invar of the prior art is insufficient in any properties. On the contrary, when using the product of the present invention as a tool material, it is confirmed that the requirement for such a high precision can sufficiently be satisfied.

TABLE 18

| | Results | |
|---|---|---|
| Assessment Tool | Flatness (μm) | Largest Temp. Gradient (°C.) |
| Tool No. 28 (Present Invention) | 2.4 | 5 |

TABLE 18-continued

| Assessment Tool | Results | |
|---|---|---|
| | Flatness ($\mu$m) | Largest Temp. Gradient (°C.) |
| Tool No. 29 (Prior Art) | 8.3 | 28 |

Furthermore, using these tools, liquid crystal display driver LSI was mounted on a glass substrate. The mounting was carried out by a constant heating system through ACF consisting of a thermosetting resin. Furthermore, cleaning of the tool was carried out by rubbing the tool surface with a sand paper of No. 400 to remove adhered substances every mounting of 1000 times.

As a result, Tool No. 28 of the present invention was capable of bonding uniformly and well any parts $5 \times 10^4$ times and further effecting continuously the mounting, whilst Tool No. 29 for comparison resulted in poor bonding in the vicinity of both the end parts of the tool pressing surface after mounting $1 \times 10^4$ times.

Example 11

Figure 13:
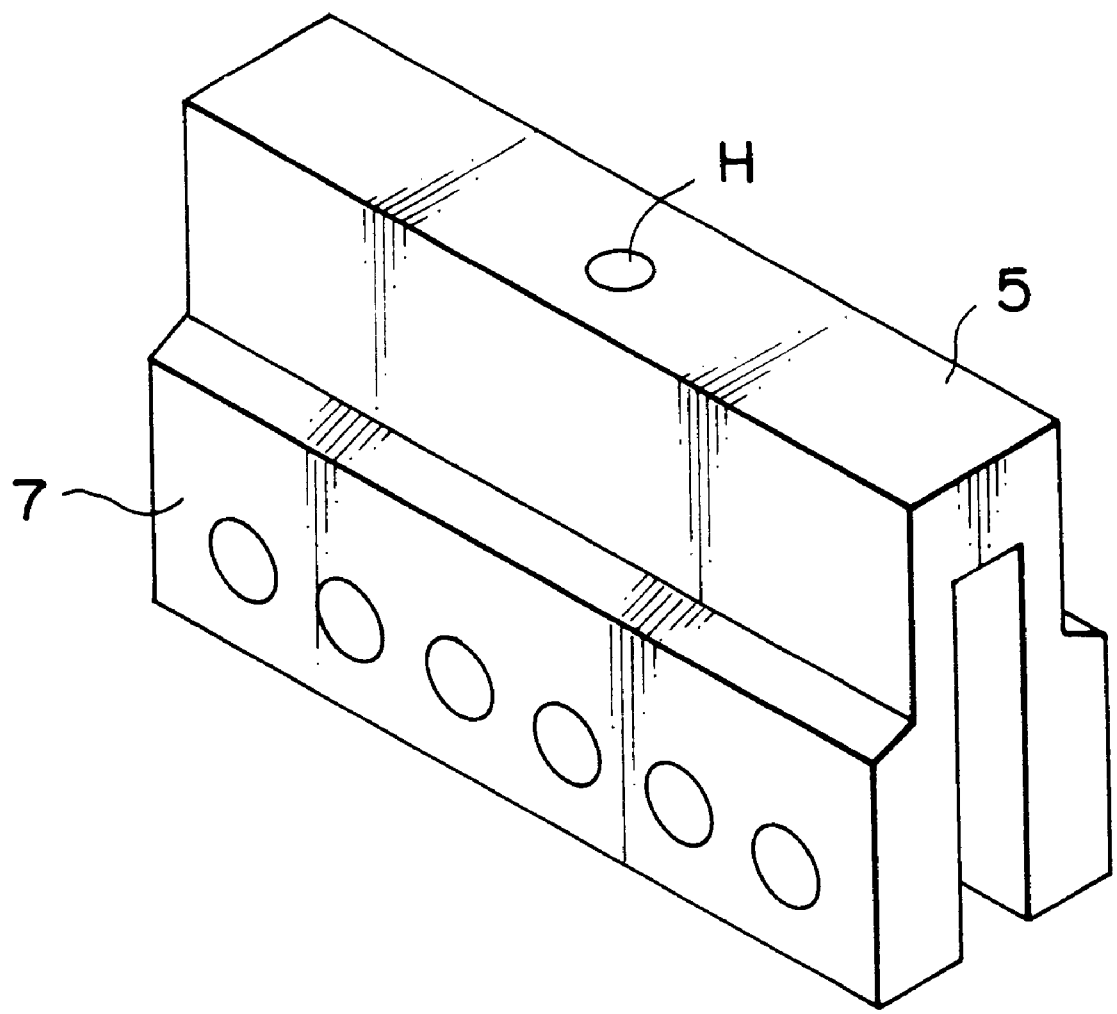
FIG. 13 is a schematic view of a still further embodiment of the bonding tool of the present invention, of such a type that the substrate is directly coated with polycrystalline diamond, used in Example 11.

A cemented carbide containing 90 weight % of WC, 5 weight % TaC and 5 weight % of Co was worked by polishing and discharging to form a cemented carbide shank with a shape shown in FIG. 13. The surface 5 to be coated with polycrystalline diamond to be a tool end surface had a dimension of 25 mm×15 mm.

Then, this cemented carbide was subjected to a heat treatment by maintaining it in a $N_2$ atmosphere of 110 Torr at a temperature of 1390° C. for 2 hours and cooling to room temperature in vacuum. Microscopic protrusions consisting of carbide solid solution of W and Ta were formed on the surface by this heat treatment and gaps among these protrusions were filled with Co coming out of the inside of the cemented carbide.

When this cemented carbide was immersed in hydrochloric acid at 50° C. and only Co comming out was dissolved and removed, a cemented carbide whose surface was covered with microscopic protrusions consisting of (W,Ta)C having a mean length of 4 $\mu$m was prepared. It was confirmed that the thus surface-modified cemented carbide had a coefficient of linear expansion of $4.5 \times 10^{-6}$/° C. at a temperature range of room temperature to 400° C., which was similar to that of the cemented carbide before the heat treatment.

This cemented carbide, as a substrate, was then arranged in a microwave plasma CVD apparatus in such a manner that the surface 5 of 25 mm×15 mm be a surface to be coated as a tool end and subjected to coating of polycrystalline diamond for 32 hours. The synthetic conditions are shown in Table 19.

TABLE 19

| Microwave Output | 600 W |
|---|---|
| Substrate Temperature | 870° C. |
| Raw Material Gas Composition | $CH_4/H_2$ = 1.2% |
| Total Flow Rate of Raw Material Gas | 400 sccm |
| Gas Pressure | 120 Torr |

The recovered cemented carbide had polycrystalline diamond coated on the surface thereof in a thickness of 60 $\mu$m. This polycrystalline diamond was confirmed to have a very high purity represented by a peak ratio (Y/X) of 0.06, wherein X represents diamond carbon and Y represents non-diamond carbon, by Raman spectroscopic analysis. When the preferred orientation of the diamond was examined by X-ray diffraction, furthermore, it was found that it was orientated in the film thickness direction (110).

The polycrystalline diamond-coated cemented carbide was subjected to polishing working by a diamond wheel while heating so that about the central part of the polycrystalline diamond-coated surface to be a tool pressing surface be at a temperature of 380° C. and consequently, it was converted into a mirror state with a surface roughness of 0.07 $\mu$m by Rmax representation. The thickness of the polycrystalline diamond after the mirror surface working was 20 $\mu$m.

The resulting tool was then subjected to assessment of ①  thermal response, ② temperature distribution of tool pressing surface and ③ flatness of tool pressing surface as follows:

The thermal response ① was assessed by passing electric current through the tool at room temperature and then measuring a time required for raising the temperature from the start of passing electric current to 380° C. and a time required for cooling from 380° C. to 200° C. from the stop of passing electric current. The temperature distribution ② was assessed by measuring, when the central part of the tool end surface was maintained at a temperature of 380° C., the temperatures of some parts of the tool pressing surface in the similar manner to Example 10 to assess the largest temperature gradient.

The flatness of tool pressing surface ③ was assessed by measuring the warped state of the tool surface in the similar manner to Example 10, when the central part of the tool end surface is maintained at room temperature and 380° C.

For comparison, assessment of an Mo tool (Tool No. 31) and a Super Invar tool (Tool No. 32) was carried out.

The results are shown in Table 20. As is evident from these results, the tool of the present invention can favorably be compared with the tools of the prior art in all the respects of thermal response, uniformity of temperature distribution and flatness.

TABLE 20

| | Results of Assessments | | | |
|---|---|---|---|---|
| Tool No. | Thermal Response at Heating (sec) | Thermal Response at Cooling (sec) | Largest Temperature Gradient (° C.) | Flatness at 380° C. ($\mu$m) |
| Present Invention | | | | |
| 30 | 1.0 | 8.9 | 6 | 2.1 |
| Comparative Examples | | | | |
| 31 | 1.1 | 9.0 | 20 | 18.6 |
| 32 | 1.8 | 18.5 | 30 | 12.5 |

Furthermore, using these tools, MPU for personal computer was mounted on a printed circuit. The mounting was carried out by a pulse heating system by adjusting the tool highest temperature to 380° C., because of carrying out the mounting by melting and solidifying a Pb—Sn solder bump fromed on MPU surface. Furthermore, cleaning of the tool was carried out in an analogous manner to Example 10.

As a result, Tool No. 30 of the present invention was capable of bonding uniformly and well any parts $10 \times 10^4$ times and further effecting continuously the mounting, whilst Tool Nos. 31 and 32 for comparison resulted in poor bonding in articles bonded in the vicinity of both the end parts of the pressing surface after mounting $1 \times 10^4$ times.

Example 12

A cemented carbide containing 88 weight % of WC, 7 weight % TiC and 5 weight % of Co was worked in a shape of 20 mm×2 mm×2 mm. Then, this cemented carbide was subjected to a heat treatment by maintaining it in a CO atmosphere of 180 Torr at a temperature of 1420° C. for 1 hour and cooling to room temperature in vacuum. Microscopic protrusions consisting of carbide solid solution of W and Ti were formed on the surface by this heat treatment and gaps among these protrusions were filled with Co coming out of the inside of the cemented carbide.

When this cemented carbide was immersed in nitric acid kept warm at 25° C. and only Co comming out was dissolved and removed, a cemented carbide whose surface was covered with microscopic protrusions consisting of (W,Ti)C having a mean length of 5 μm was prepared.

This cemented carbide, as a substrate, was then arranged in a thermal filament CVD apparatus in such a manner that the surface of 20 mm×2 mm be a surface to be coated as a tool end and subjected to coating of polycrystalline diamond for 30 hours. The synthetic conditions are shown in Table 21.

TABLE 21

| Filament Property | Linear W Wire of 0.5 mm |
|---|---|
| Filament Temperature | 2050° C. |
| Filament-Substrate Distance | 6 mm |
| Substrate Temperature | 950° C. |
| Raw Material Gas Composition | $CH_4/H_2$ = 1.3% |
| Total Flow Rate of Raw Material Gas | 1200 sccm |
| Gas Pressure | 100 Torr |

The recovered cemented carbide had polycrystalline diamond coated on the surface thereof in a thickness of 40 μm. The polycrystalline diamond-coated cemented carbide was bonded to a shank made of Mo using a brazing material consisting of, by weight, 68Ag-27Cu-5Ti having a melting point of 800° C. It was confirmed by assessment of the shearing strength that the bonding strength with the brazing material was 22 kg/mm².

The polycrystalline diamond-coated surface at the tool end was polished by a diamond wheel and worked into a mirror state with a surface roughness of 0.08 μm by Rmax representation. The thickness of the polycrystalline diamond after mirror surface working was 20 μm.

The tool obtained by the above described method was subjected to coating the surface of the brazing material with each of metallic materials described in Table 22 by each of methods described in Table 22. In this case, the coating C was carried out about the exposed side surface of the brazing material as shown in FIG. 5. For comparison, a tool free from this coating was prepared. In FIG. 5, 3 designates a cemented carbide substrate, 5 designates polycrystalline end surface, 6 designates a machine-fitting part, 7 designates a shank, 8 designates a brazing material and C designates a coated part.

TABLE 22

| Tool No. | Coating Material | Coating Thickness (μm) | Coating Method |
|---|---|---|---|
| Present Invention | | | |
| 33 | Cr | 30 | Plating |
| 34 | Mo | 3 | Ion Plating |
| 35 | Pd | 2 | Sputtering |
| 36 | W | 15 | CVD |
| Comparison | | | |
| 37 | no coating | — | — |
| 38 | Mo | 0.2 | Sputtering |
| 39 | Ni | 300 | Plating |

In order to assess the durability of these tools in bonding applications with a solder, each of the tools, whose end temperature was adjusted to 400° C. was repeatedly pressed to a solder plate of 5 mm thick $80 \times 10^4$ times. The results are shown in Table 23. In Table 23, the shearing strength is represented by a value after th above described repetition assessment as to a tool as not separated.

TABLE 23

| Tool No. | Repetition Assessment | Shearing Strength (Kg/mm²) |
|---|---|---|
| Present Invention | | |
| 33 | no falling-off of tool end after $80 \times 10^4$ times | 23 |
| 34 | -do- | 22 |
| 35 | -do- | 21 |
| 36 | -do- | 22 |
| Comparative Example | | |
| 37 | falling-off of tool end after $25 \times 10^4$ times | — |
| 38 | no falling-off of tool end after $80 \times 10^4$ times | 3 |
| 39 | falling-off of tool end after $35 \times 10^4$ times | — |

As is evident from this table, Tool Nos. 33 to 36 coated according to the present invention are capable of maintaining the high bonding strength unchanged even after operations of $80 \times 10^4$ times, while Tool No. 37 of the prior art not coated meets with falling-off of tool the end part by a relatively small number of the operations. It is found by analysis of the brazed surface of the separated tool end part that this is caused by alloying of the melted solder and brazing material to result in an alloy composition with a low strength.

In Tool No. 38, the falling-off of the tool end part does not occur, but the bonding strength is largely lowered because the thickness of Mo coated is too thin to maintain the coating effect. In the case of Tool No. 39, the end part is fallen off by the operation in a relatively short time, which is considered due to that the coated thickness of Ni is too large, i.e. 300 μm and consequently, partial stripping takes place during operation, thus resulting in alloying of the melted solder with the brazing material from the stripped part.

Example 13

A cemented carbide containing 90 weight % of WC, 5 weight % TaC and 5 weight % of Co was worked in a shape of 30 mm×2 mm×1 mm. Then, this cemented carbide was subjected to a heat treatment by maintaining it in a CO atmosphere of 150 Torr at a temperature of 1380° C. for 2 hours and cooling to room temperature in vacuum. Microscopic protrusions consisting of carbide solid solution of W and Ta were formed on the surface by this heat treatment and gaps among these protrusions were filled with Co coming out of the inside of the cemented carbide.

When this cemented carbide was immersed in hydrofluoric acid kept warm at 50° C. and only Co comming out was dissolved and removed, a cemented carbide whose surface was covered with microscopic protrusions consisting of (W,Ta)C having a length of 7 μm was prepared.

This cemented carbide, as a substrate, was then arranged in a microwave plasma CVD apparatus in such a manner that the surface of 30 mm×2 mm be a surface to be coated as a tool end and subjected to coating of polycrystalline diamond for 25 hours. The synthetic conditions are shown in Table 24.

TABLE 24

| Microwave Output | 700 W |
|---|---|
| Substrate Temperature | 850° C. |
| Raw Material Gas Composition | $CH_4/H_2 = 0.8\%$ |
| Total Flow Rate of Raw Material Gas | 400 sccm |
| Gas Pressure | 75 Torr |

The recovered cemented carbide had polycrystalline diamond coated on the surface thereof in a thickness of 50 μm. The polycrystalline diamond-coated cemented carbide was bonded to a shank made of Mo using a brazing material consisting of, by weight, 60Au-37Cu-31n having a melting point of 860° C. It was confirmed by assessment of the shearing strength that the bonding strength with the brazing material was 25 Kg/mm².

The polycrystalline diamond-coated surface at the tool end was polished by a diamond wheel and worked into a mirror state with a surface roughness of 0.07 μm by Rmax representation. The thickness of the polycrystalline diamond after mirror surface working was 25 μm.

The tool obtained by the above described method was subjected to coating of the side in the vicinity of the tool brazed layer with a ceramic thin film utilizing hydrolysis of a metal alkoxide by the following procedure. Namely, other parts of the tool than the coating part as shown in FIG. 5, were covered with a masking tape, immersed in a solution of silicon ethoxide diluted with isopropyl alcohol and drawn up. The masking tape was separated and the coated tool was then heated at 180° C. in the air for 1 hour, dried and hardened. By this treatment, an $SiO_2$ thin film with a thickness of 5 μm was coated onto only the coating part shown in FIG. 5.

Tool No. 40 obtained in this way was subjected to assessment of the etching resistance to the melted solder in the similar manner to Example 12. For comparison, Tool No. 41 free from this coating treatment was also assessed.

Consequently, in Tool No. 41 of the prior art which had not been subjected to the coating treatment of the surface of the brazing material, falling-off of the tool end part occurred when the repetition assessment of $2 \times 10^4$ times was carried out, while in Tool No. 40 according to the present invention, there was found no change in the brazing strength even after the repetition assessment of $80 \times 10^4$ times.

In Tool No. 41, Au as a component of the brazing material was reacted with Sn as a component of the solder to form brittle intermetallic compounds such as $AuSn$, $AuSn_2$, $AuSn_4$, etc., while in Tool No. 40, it was confirmed that this reaction was prevented by the $SiO_2$ thin film coated.

Example 14

A cemented carbide containing 85 weight % of WC, 7 weight % of (Ti,Ta)C and 8 weight % of Co was worked in a shape of 40 mm×1 mm×1 mm. Then, this cemented carbide was subjected to a heat treatment by maintaining it in a $N_2$ atmosphere of 80 Torr at a temperature of 1350° C. for 2 hour and cooling to room temperature in vacuum. Microscopic protrusions consisting of carbide solid solution of W, Ti and Ta were formed on the surface by this heat treatment and gaps among these protrusions were filled with Co coming out of the inside of the cemented carbide.

When this cemented carbide was immersed in hydrofluoric and nitric acid kept warm at 80° C. and only Co comming out was dissolved and removed, a cemented carbide whose surface was covered with microscopic protrusions consisting of (W,Ti,Ta)C having a length of 6 μm was prepared.

This cemented carbide, as a substrate, was then arranged in a thermal filament CVD apparatus in such a manner that the surface of 40 mm×1 mm be a surface to be coated as a tool end and subjected to coating of polycrystalline diamond for 50 hours. The synthetic conditions are shown in Table 25.

TABLE 25

| Filament Property | Linear Ta Wire of 0.6 mm |
|---|---|
| Filament Temperature | 2000° C. |
| Filament-Substrate Distance | 8 mm |
| Substrate Temperature | 900° C. |
| Raw Material Gas Composition | $CH_4/H_2 = 1.0\%$ |
| Total Flow Rate of Raw Material Gas | 800 sccm |
| Gas Pressure | 80 Torr |

The recovered cemented carbide had polycrystalline diamond coated on the surface thereof in a thickness of 80 μm. The polycrystalline diamond-coated cemented carbide was bonded to a shank made of Mo using a brazing material consisting of, by weight, 60Cu-30Au-10Ni having a melting point of 900° C. It was confirmed by assessment of the shearing strength that the bonding the brazing material was 26 kg/mm².

The polycrystalline diamond-coated surface at the tool end was polished by a diamond wheel and worked into a mirror state with a surface roughness of 0.07 μm by Rmax representation. The thickness of the polycrystalline diamond after mirror surface working was 40 μm.

This tool was subjected to coating by various methods shown in Table 26 to complete pulse heating tools. These coating methods were similar to those of Examples 12 and 13. For comparison, a tool free from this coating was also prepared.

TABLE 26

| Tool No. | Coating Material | Coating Thickness (μm) | Coating Method |
|---|---|---|---|
| Present Invention | | | |
| 42 | $ZrO_2$ | 10 | Hydrolysis |
| 43 | Pd | 3 | Ion Plating |
| 44 | $Al_2O_3$ | 30 | Hydrolysis |
| 45 | $TiO_2$ | 50 | CVD |
| 46 | Cr | 40 | Plating |
| 47 | Ni | 20 | Plating |
| 48 | Pt | 5 | Sputtering |
| Comparison | | | |
| 49 | no coating | — | — |

In order to assess the properties of these tools, outer lead bonding of a printed circuit was carried out by pulse heating at 15 second cycle so that the tool end temperature be adjusted to 400° C.

The results are shown in Table 27. As apparent from these results, the sent invention were all resistant to bonding $80 \times 10^4$ times and exhibited no change in the bonding strength, while in the case of Tool No. 49 of the prior art, in which the surface of the brazing material had not been subjected to the coating treatment, separation of the tool end part occurred when bonding $3 \times 10^4$ times.

TABLE 27

| Tool No. | Repetition Assessment | Shearing Strength (Kg/mm$^2$) |
| --- | --- | --- |
| Present Invention | | |
| 42 | no problem in amounting $80 \times 10^4$ times | 26 |
| 43 | no problem in amounting $80 \times 10^4$ times | 27 |
| 44 | no problem in amounting $80 \times 10^4$ times | 25 |
| 45 | no problem in amounting $80 \times 10^4$ times | 26 |
| 46 | no problem in amounting $80 \times 10^4$ times | 26 |
| 47 | no problem in amounting $80 \times 10^4$ times | 25 |
| 48 | no problem in amounting $80 \times 10^4$ times | 26 |
| Comparative Example | | |
| 49 | falling-off of tool end part after $3 \times 10^4$ times | |

Advantages of Present Invention

According to the present invention, there are provided the bonding tools having the following advantages:

(1) More excellent wear resistance, heat resistance, strength and thermal response than those of the bonding tools of the prior art can be attained. That is, the reliability upon the strength of the substrate, which has hitherto been considered questionable in the constant heating tool of the prior art, can largely be improved, and good results can be obtained as to the thermal response which has been hitherto considered questionable.

(2) More excellent properties and higher precision can be exhibited even if having a longer size, as compared with the bonding tools of the prior art.

(3) The bonding tool of the present invention is resistant to use for a longer time as compared with that of the prior art. The flatness and temperature distribution of the tool end surface in the operation at a high temperature can well be maintained without deteriorating the thermal response and these better properties are not changed even after using for a long time.

(4) Since the flatness and temperature distribution of the tool end surface can be maintained in good state without thermal damage for a long time, better flip chip mounting can be realized as compared with the prior art tools.

(5) Higher etching resistance to a melted solder can be obtained as compared with the prior art tools. The reliability upon the bonding strength of the tool end part, which is a large problem in the pulse heating tool having the brazed structure of the prior art, can largely be improved, thus resulting in better properties the diamond tool intrinsically has.

We claim:

1. A mounting tool comprising a rectangular frame-shaped hollow square frustum, having an end surface to be a pressing surface, the rectangular frame-shaped end surface consisting of a coating of a polycrystalline diamond oriented in the (100) plane and/or (110) plane in the thickness direction, formed by a gaseous phase synthesis method, the thickness of said coating being 15 to 100 $\mu$m, the surface being of a mirror surface with a surface roughness of at most 0.1 $\mu$m by Rmax representation and having such a property that the maximum temperature gradient in the pressing surface is at most 20° C.

2. A mounting tool comprising a rectangular frame-shaped hollow square frustum, having an end surface to be a pressing surface, the rectangular frame-shaped end surface consisting of a coating of a polycrystalline diamond oriented in the (100) plane and/or (110) plane in the thickness direction, formed by a gaseous phase synthesis method, the thickness of said coating being 15 to 100 $\mu$m, the surface being of a mirror surface with a surface roughness of at most 0.1 $\mu$m by Rmax representation and having such a property that when the maximum temperature of the pressing surface is in the range of 220 to 600° C., the flatness of the pressing surface is at most 3 $\mu$m and the maximum temperature gradient in the pressing surface is at most 20° C.

3. A mounting tool comprising a substrate consisting of a cemented carbide having microscopic protrusions of hard carbides and/or hard carbonitrides on at least one surface, having a rectangular frame-shaped end surface of a hollow square frustum, to be a pressing surface and a coefficient of linear expansion of $4.0 \times 10^{-6}$ to $5.5 \times 10^{-6}$/° C. at room temperature to 400° C. and a polycrystalline diamond coating formed on the above described surface having microscopic protrusions by a gaseous phase synthesis method, the surface coated with the polycrystalline diamond coating having a mirror surface with a surface roughness of at most 0.1 $\mu$m by Rmax representation and such a property that the maximum temperature gradient in the pressing surface is at most 20° C.

4. The mounting tool, as claimed in claim 3, wherein the microscopic protrusions composed of hard carbides and/or hard carbonitrides on the cemented carbide surface penetrate into the polycrystalline diamond layer coated on the surface.

5. The mounting tool, as claimed in any one of claims 1 to 3, wherein the pressing surface consisting of a polycrystalline diamond-coated cemented carbide and a shank consisting of a metal or alloy are bonded through a bonding metal having a melting point of 800 to 1200° C.

6. The mounting tool, as claimed in any one of claims 1 to 3, wherein polycrystalline diamond is directly coated on a shank consisting of a cemented carbide.

7. The mounting tool, as claimed in any one of claims 1 to 3, wherein a part or whole of the shank consists of cemented carbides, Mo, W, Cu—W alloy, Cu—Mo alloy, W—Ni alloy, Kovar alloy and Invar alloy.

8. A tool used for directly mounting LSI on a substrate by a flip chip method, comprising a pressing surface of a tool end, the pressing surface consisting of polycrystalline diamond formed by a gaseous phase synthesis method, the pressing surface being of a mirror surface with a surface roughness of at most 0.1 $\mu$m by Rmax representation, having at least one vacuum adsorption hole made in the surface and having such a property that when the highest temperature of the pressing surface is in the range of 230 to 400° C., the flatness of the pressing surface is at most 5 $\mu$m and the maximum temperature gradient in the pressing surface is at most 30° C.

9. A flip chip mounting tool comprising a substrate consisting of a cemented carbide having microscopic protrusions of hard carbides and/or hard carbonitrides on at least one surface, having a pressing surface at the tool end and a coefficient of linear expansion of $4.0 \times 10^{-6}$ to $5.5 \times 10^{-6}/°$ C. at room temperature to 400° C., and a polycrystalline diamond coating formed on the above described surface having microscopic protrusions by a gaseous phase synthesis method, the surface coated with the polycrystalline diamond coating having a mirror surface with a surface roughness of at most 0.1 $\mu$m by Rmax representation, having at least one vacuum adsorption hole made in the surface and having such a property that when the highest temperature of the pressing surface is in the range of 230 to 400° C., the flatness of the pressing surface is at most 5 $\mu$m and the maximum temperature gradient in the pressing surface is at most 30° C.

10. The flip chip mounting tool, as claimed in claim 9, wherein the microscopic protrusions composed of hard carbides and/or hard carbonitrides on the cemented carbide surface penetrate into the polycrystalline diamond layer coated on the surface.

11. The flip chip mounting tool, as claimed in claim 8 or 9, wherein the pressing surface consisting of a polycrystalline diamond-coated cemented caride and a shank consisting of a metal or alloy are bonded through a bonding metal having a melting point of 650 to 1200° C.

12. The flip chip mounting tool, as claimed in claim 8 or 9, wherein polycrystallined diamond is directly coated on the end pressing surface of a shank consisting of a cemented carbide.

13. The flip chip mounting tool, as claimed in claim 8 or 9, wherein the thickness of the coated polycrystalline diamond is 15 to 100 $\mu$m.

14. The flip chip mounting tool, as claimed in claim 8 or 9, wherein a part or whole of the shank consists of cemented carbides, Mo, W, Cu—W alloy, Cu—Mo alloy, W—Ni alloy, Kovar alloy and Invar alloy.

15. The flip chip mounting tool, as claimed in claim 8 or 9, wherein the coated polycrystalline diamond is orientated in (100) plane and/or (110) plane in the thickness direction.

* * * * *